(12) United States Patent
Yakymyshyn et al.

(10) Patent No.: US 7,221,813 B2
(45) Date of Patent: May 22, 2007

(54) SIGNAL ACQUISITION PROBING AND VOLTAGE MEASUREMENT SYSTEMS USING AN ELECTRO-OPTICAL CAVITY

(75) Inventors: Christopher P. Yakymyshyn, Seminole, FL (US); William Q. Law, Beaverton, OR (US); William A. Hagerup, Portland, OR (US); Timothy R. Piwonka-Corle, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 203 days.

(21) Appl. No.: 11/077,787

(22) Filed: Mar. 10, 2005

(65) Prior Publication Data

US 2005/0200362 A1 Sep. 15, 2005

Related U.S. Application Data

(60) Provisional application No. 60/552,334, filed on Mar. 10, 2004.

(51) Int. Cl.
*G02B 6/00* (2006.01)
*G01R 31/00* (2006.01)
*G01B 9/02* (2006.01)

(52) U.S. Cl. ............ 385/12; 385/2; 385/8; 385/39; 385/40; 385/14; 324/501; 356/454

(58) Field of Classification Search ............ 385/1, 385/2, 3, 4, 8, 39, 40, 14, 12; 324/501; 356/73.1, 356/454
See application file for complete search history.

(56) References Cited

U.S. PATENT DOCUMENTS

| | | | |
|---|---|---|---|
| 3,892,469 A | 7/1975 | Lotspeich | 350/150 |
| 4,196,396 A | 4/1980 | Smith | 330/4.3 |
| 4,755,415 A | 7/1988 | Iijima et al. | 428/163 |
| 5,071,232 A | 12/1991 | Kato et al. | 359/315 |
| 5,074,631 A | 12/1991 | Hamano et al. | 385/3 |
| 5,263,102 A | 11/1993 | Hakogi | 385/2 |
| 5,353,262 A | 10/1994 | Yakymyshyn | 367/149 |
| 5,394,098 A | 2/1995 | Meyrueix | 324/750 |
| 5,808,473 A | 9/1998 | Shinagawa et al. | 324/753 |
| 6,044,190 A | 3/2000 | Kashyap | 385/123 |
| 6,166,845 A | 12/2000 | Ito | 359/245 |

(Continued)

OTHER PUBLICATIONS

P.O. Müller et al., "An External Electrooptic Sampling Technique Based on the Fabry-Perot Effect," IEEE Journal of Quantum Electronics, vol. 35, No. 1, Jan. 1999.

(Continued)

*Primary Examiner*—Brian M. Healy
(74) *Attorney, Agent, or Firm*—William K. Bucher

(57) ABSTRACT

A signal acquisition probing system uses an optical cavity to acquire a signal under test. The probing system has an optical transmitter and receiver that are coupled to the optical cavity via an optical transmission system. The optical cavity has an electrode structure having apertures formed in the optical cavity that are parallel to propagation path of the optical signal within the cavity. A modulated optical signal is generated by the optical cavity in response to the signal under test creating an electro-magnetic field distribution in electro-optic material in the optical cavity that overlaps the optical path of the optical signal propagating in the optical cavity which varies the index of refraction of electro-optic material in the optical path. The signal acquisition probing system is connected to a measurement instrument to form a voltage measurement system.

45 Claims, 18 Drawing Sheets

U.S. PATENT DOCUMENTS

| | | | |
|---|---|---|---|
| 6,246,815 B1 | 6/2001 | Fujiwara et al. | 385/37 |
| 6,402,549 B1 | 6/2002 | Ayres | 439/578 |
| 6,402,565 B1 | 6/2002 | Pooley | 439/680 |
| 6,498,651 B1 * | 12/2002 | Loil | 356/476 |
| 6,603,891 B2 | 8/2003 | Schumann | 385/12 |
| 6,629,048 B1 | 9/2003 | Law | 702/64 |
| 7,042,917 B2 * | 5/2006 | Tuganov et al. | 372/20 |
| 7,099,015 B2 * | 8/2006 | Melnyk | 356/480 |
| 2005/0200362 A1 * | 9/2005 | Yakymyshyn et al. | 324/501 |

OTHER PUBLICATIONS

D. Le Quang et al., "MMIC-Calibrated Probing by CW Electrooptic Modulation," IEEE Transactions on Microwave Theory and Techniques, vol. 43, No. 5, May 1995.

* cited by examiner

SIGNAL ACQUISITION PROBING AND VOLTAGE MEASUREMENT SYSTEMS USING AN ELECTRO-OPTICAL CAVITY

CROSS-REFERENCE TO RELATED APPLICATION

This application claims the benefit of the U.S. Provisional Application No. 60/552,334, filed Mar. 10, 2004.

BACKGROUND OF THE INVENTION

The present invention relates generally to signal acquisition probes and more particularly to signal acquisition probing systems using electro-optical cavities that are incorporated into voltage measurement systems.

Electro-optic material is a class of inorganic and organic crystals where the index of refraction of the material changes in response to electromagnetic energy applied to the material. Such material may be used in the production of optical devices, such as optical switches, optical limiters, optical modulators and the like. In it simplest form, an optical signal, such as the output of a laser or the like, is launched into the electro-optic material having length and widths in the millimeter range and thicknesses in the tenths of millimeter range. The diameter of the optical path of the optical signal within the electro-optic material generally ranges from ten to a few hundreds microns across. Electrodes are formed on opposing surfaces of the electro-optic material that are parallel to the optical path of the signal passing through the electro-optic material. An electrical signal is applied to the electrodes which varies the index of refraction of the electro-optic material as a function of the variations of the electrical signal. The variations of the index of refraction of the electro-optic material alters the optical signal propagating through the electro-optic material.

Optically reflective material may be disposed on opposing sides of the electro-optic material to form an optical cavity. A Fabry-Perot etalon is an example of such an optical cavity. The reflectivity of the optically reflective material on the opposing sides of the electro-optic material is defined by the particular application of the optical cavity. The optical signal passes through at least one of the optically reflective materials and into the electro-optic material. Electrodes are formed on opposing surfaces of the electro-optic material that are parallel to the optical path of the optical signal. An electrical signal applied to the electrodes varies the index of refraction of the electro-optic material as a function of the variations in the electrical signal.

The strength of the electric field distribution within the electro-optic material is a function of the distance between the opposing electrodes and the amplitude of the applied electrical signal. The strength of the electric field is the inverse of the distance separation of the electrodes. As the distance between the electrodes decreases, the strength of the electric field between them increases. As the distance decreases, the magnitude of the electrical signal can decrease to generate the same amount of change in the index of refraction.

Currently, the minimum overall dimensions of the electro-optic material used in optical devices and cavities is limited by the practical size at which the material can be handled resulting in electrodes that are positioned at a substantial distance from the optical path of the optical signal. This results in optical devices having low sensitivity to the applied electrical signal.

There is an increasing need in the electronics industry for measurement test equipment, such as oscilloscopes, logic analyzers and the like, to measure electrical signals in the gigahertz range. Correspondingly, there is a need for measurement instrument signal acquisition probes that have the signal bandwidth to acquire such high frequency signals. Generally gigahertz bandwidth signal acquisition probes have active circuitry in the probing head of the probe that receives the electrical signal via a metal probing tip extending from the end of the probing head. Extensive design work is required to minimize probe tip inductance and capacitance that affect the overall bandwidth of the probe. In addition, the dielectric constant of the probe head material also needs to be minimized for gigahertz differential signal acquisition probes. A further complication for gigahertz signal acquisition probe designs is the signal loss through the coaxial cable that couples the probing head to the measurement instrument.

U.S. Pat. No. 5,808,473, titled "Electric Signal Measurement Apparatus Using Electro-Optic Sampling by One Point Contact" describes an electro-optic sampling high-impedance probe exploiting the Pockels effect to rotate the polarization state of a light beam. The Pockels effect changes the birefringence of an electro-optic crystal by an amount that is proportional to an electric field inside the crystal. With the proper application of electrodes to the crystal surface, and their connection to conductive probing tips, the polarization rotation can be made to respond to a voltage on a device under test (DUT). The electro-optic sampling high-impedance probe receives polarization maintained laser pulses via a single mode polarization maintaining fiber. The laser pulses are coupled through bulk optic devices onto an electro-optic element having a reflective film on one end. A metal pin in the end of the signal probe head abuts the reflective film on the electro-optic element. The metal pin couples an electrical signal from a device under test to the electro-optic element which alters the birefringence of the electro-optic element in response to the electrical field of the signal causing the polarization state of the laser beam to change. The laser beam having the changed polarization state is reflected by the reflecting film and coupled through polarization beam splitters which convert the S and P polarized beams into an intensity change. The S and P polarized beams are coupled through respective condensing lenses onto respective slow germanium photodetectors that convert the optical beams into electrical signals. The electrical signals are coupled to a measurement instrument and detected by a differential amplifier.

U.S. Pat. No. 6,166,845 describes a modification to the above described electro-optic sampling high-impedance probe. Instead of coupling laser pulses via a single mode polarization maintaining fiber to the probe, a laser diode is incorporated into the probe itself. The laser diode generates a pulsed laser output in response to an input pulse chain from the measurement instrument. The probe contains the bulk optic devices, electro-optic element and photodetectors as previously described. The metal pin couples the electrical signal from a device under test to the electro-optic element which alters the birefringence of the electro-optic element in response to the electrical field of the signal causing the polarization state of the laser beam to change. The S and P polarized beams are coupled through the beam splitters and the condensing lenses onto the photodetectors. The photodetectors convert the intensity beams into electrical signals and couple the electrical signals to the measurement instrument.

A drawback to this type of probe is the size of the probing head due to the number of optical elements contained therein. Further, voltage and signal lines are required to couple the voltage power to the laser diode and photodetectors, couple the drive signal to the laser diode and to couple the outputs of the photodetectors to the measurement instrument.

U.S. Pat. No. 5,353,262 describes an ultrasound optical transducer that generates an optical signal the frequency of which varies in correspondence with acoustic energy incident on the transducer. The transducer includes a housing in which is disposed a signal laser. The signal laser is preferably a microchip laser, microcavity laser or the like. The signal laser has an optical cavity disposed between first and second reflectors and in which a lazing medium (also known as a gain crystal) is disposed. The reflectors are disposed on opposing plane-parallel surfaces of the lasing medium. An optical source injects an optical signal at a first frequency into the signal laser, which generates a second output signal at a second frequency. Acoustic energy impinging on the transducer causes the index of refraction of the optical cavity to change which in turn, causes the frequency of the signal laser to change. The frequency modulated optical signal from the signal laser is coupled to signal processing assembly that generates an output signal corresponding to the amplitude of the incident acoustic energy for use in imaging and analysis. An alternative embodiment is described where a piezoelectric device is positioned on the transducer for converting the acoustic energy into an electrical signal. The electrical signal is applied to electrodes on the signal laser. The electrical signal causes a change in the index of refraction of the optical cavity as a function of the acoustic energy applied to the piezoelectric device.

U.S. Pat. No. 4,196,396 describes the use of a Fabry-Perot enhanced electro-optic modulator to produce a bistable resonator that could be used as an optical switch, optical limiter, or optical memory device. A further embodiment taught by the '396 patent is an optical amplifier. The reference teaches the use of high voltage signals in the thousand voltage range to change the index of refraction of the electro-optic material in the Fabry-Perot cavity. Such a system does not lend itself for small signal probing applications.

U.S. Pat. No. 5,394,098 describes the use of longitudinal Pockels effect in an electro-optic sensor for in-circuit testing of hybrids and circuits assembled on circuit boards. In one embodiment, a layer of electro-optic material is disposed between opposing layers of optically reflective materials that include electrically conductive layers. The optically reflective layer having highest reflectivity to an applied optical signal is placed in contact with a conductor on the circuit board. The other optically reflective layer is coupled to electrical ground. An optical signal from a laser is applied orthogonal to the optically reflective layers on the electro-optic material. An electrical signal on the conductor of the circuit board produces a voltage potential difference across the optically reflective layers which varies the refractive index of the electro-optic material. A drawback to this design is that the orientation of the polarized optical signal is orthogonal to the orientation of the electromagnetic field producing the Pockels effect in the electro-optic material. This reduces the sensitivity of the measured electrical signal. Further, forming electrically conductive layers on the opposing sides of the electro-optic material produces capacitive and inductive effects in the electro-optic sensor that limits the useful bandwidth of the system.

What is needed is a signal acquisition probing system using an electro-optical cavity that improves the sensitivity of the electro-optical cavity to applied electrical signals. Further, there is needed a voltage measurement system using a signal acquisition probing system with an electro-optical cavity with improved sensitivity.

SUMMARY OF THE INVENTION

Accordingly, the present invention is a signal acquisition probing system usable in a voltage measurement system for sensing an electrical signal from a device under test. The signal acquisition probing system has an optical transmitter generating a tunable, coherent optical signal and an optical receiver generating an output electrical signal. An optical transmission system optically couples the optical signal from the optical transmitter to an optical cavity and couples a modulated optical signal from the optical cavity to the optical receiver. The optical cavity has optically reflective material disposed on opposing surfaces of an electro-optic material with the tunable, coherent optical signal propagating through at least one of the optically reflective materials and within the electro-optic material. First and second electrically conductive electrodes receive the electrical signal from the device under test. Each electrically conductive electrode has an apertures formed in at least a portion of the electro-optic material generally parallel to the received optical signal propagating within the electro-optic material with each electrode having electrically conductive material is disposed therein. The modulated optical signal is derived from the device under test electrical signal creating an electromagnetic field distribution in the electro-optic material that overlaps the optical path of the optical signal propagating in the electro-optic material which varies the index of refraction of the electro-optic material in the optical path. Control circuitry controls the optical power level and wavelength of the tunable, coherent optical signal from the optical transmitter and the gain of the output electrical signal from the optical receiver.

The electro-optic material has X, Y, and Z optical axes and corresponding crystal faces orthogonal to the respective X, Y, and Z optical axes. The optically reflective materials may be disposed on the opposing crystal faces orthogonal to one of the X, Y, and Z optical axis. The received optical signal propagates generally parallel to at least one of the optical axes in the electro-optic material with the first and second electrically conductive electrodes generally parallel to same optical axis. Electrically conductive contacts may be formed on an at least one exterior surface of the optical cavity with the one of the electrically conductive contacts electrically coupled to the first electrically conductive electrode and the other electrically conductive contact electrically coupled to the second electrically conductive electrode. Additionally, a resistor may be coupled between the electrically conductive electrodes or between the electrically conductive contacts. An acoustic damping material covers a substantial portion of the optical cavity to minimize acoustic modes in the optical cavity. In the preferred embodiment of the invention, the optical cavity comprises a Fabry-Perot optical cavity.

The optical transmission system may be implemented with an optical directional coupler having a first port optically coupled to the optical transmitter, a second port optically coupled to the optical receiver and a third port optically coupled to one end of an optical fiber. The other end of the optical fiber optically is coupled to one of the opposing optically reflective materials of the optical cavity. In the preferred embodiment, a collimating lens is optically coupled to the optical fiber with the collimating lens disposed adjacent to one of the opposing optically reflective materials of the optical cavity. When the signal acquisition probing system uses a Fabry-Perot optical cavity, the optical directional coupler is a polarization maintaining optical directional coupler with the first port optically coupled to the optical transmitter via a polarization maintaining optical fiber and the third port coupled to the collimating lens via a polarizing maintaining optical fiber. The optical transmission system may further be implemented with a polarizing maintaining optical fiber optically coupling the optical transmitter to the collimating lens and an optical fiber optically coupling the collimating lens to the optical receiver.

The optical receiver may be implemented with at least a first optical-to-electrical converter coupled to receive the modulated optical signal from the optical cavity via the optical transmission system. The optical receiver generates an electrical signal representative of the electrical signal from the device under test which is amplified by an amplifier. In the preferred embodiment, the optical receiver has an optical beam splitter receiving the modulated optical signal from the optical cavity. The beam splitter optically couples a first portion of the modulated optical signal to the first optical-to-electrical converter and a second portion to a second optical-to-electrical converter. The second optical-to-electrical converter generates an electrical signal that is coupled to the control circuitry for varying the wavelength of the coherent optical signal of the optical transmitter to maintain an optimum modulated reflected power from the optical cavity. Preferably, greater than ninety percent of the modulated optical signal is coupled to the first optical-to-electrical converter and less than ten percent to the second optical-to-electrical converter.

The optical transmitter, optical receiver and the control circuitry may be disposed in a probe interconnect housing wherein the measurement instrument and the probe interconnect housing have a common interface. The interface provides coupling of the electrical signal from the device under test to the measurement instrument, the coupling communications data between the measurement instrument and the signal acquisition probing system and the coupling electrical power to the signal acquisition probing system from the measurement instrument. The optical transmitter, optical receiver and control circuitry may also be disposed in a separate probe controller having a micro-controller and power supply therein. The micro-controller receives inputs for controlling the operations of the optical transmitter, optical receiver and the control circuitry and the power supply provides electrical power the optical and electrical circuits. The probe controller has optical and electrical output connectors for coupling the electrical signal from the probe controller to the measurement instrument via an electrical cable and coupling the optical signal from the optical transmitter to the optical cavity and a modulated optical signal to the optical receiver via the optical transmission system. The combination of the signal acquisition probing system with the measurement instrument, such as an oscilloscope, logic analyzer, vector network analyzer or the like forms a voltage measurement system.

The objects, advantages and novel features of the present invention are apparent from the following detailed description when read in conjunction with appended claims and attached drawings.

DETAILED DESCRIPTION OF THE PREFERRED EMBODIMENT

Figure 1A:
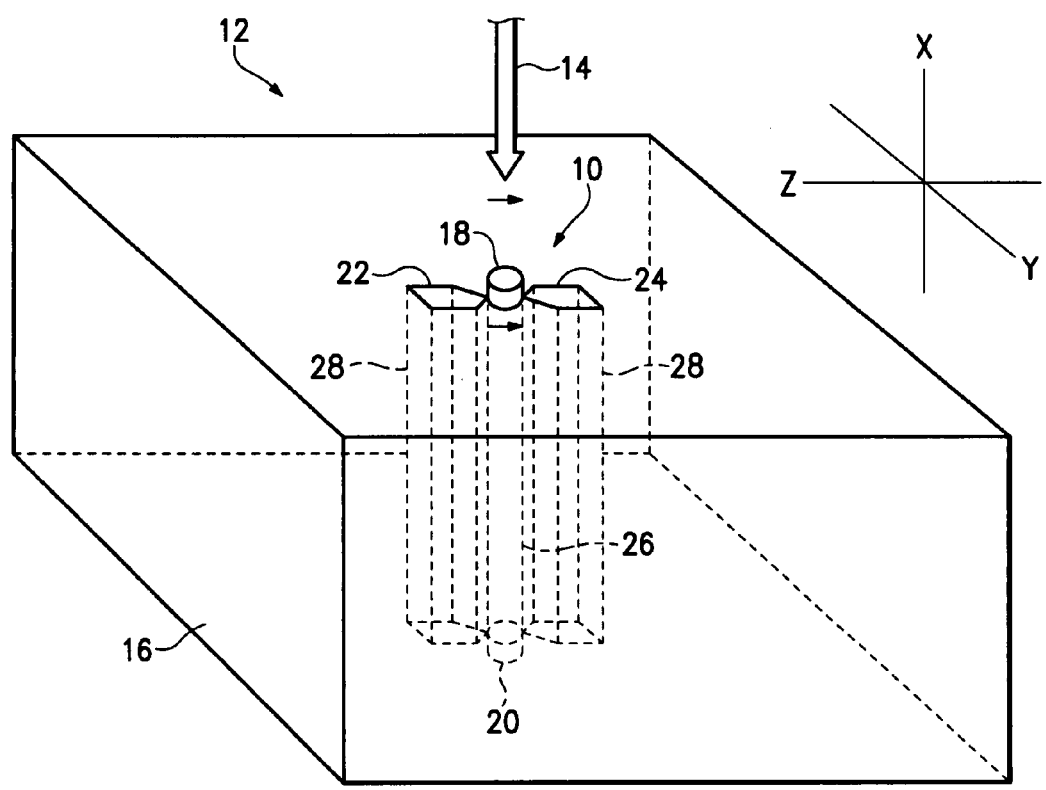
FIGS. 1A–1C illustrate alternative electrode configurations of the electrode structure for optical cavity used in a signal acquisition probing system according to the present invention.
Figure 1B:
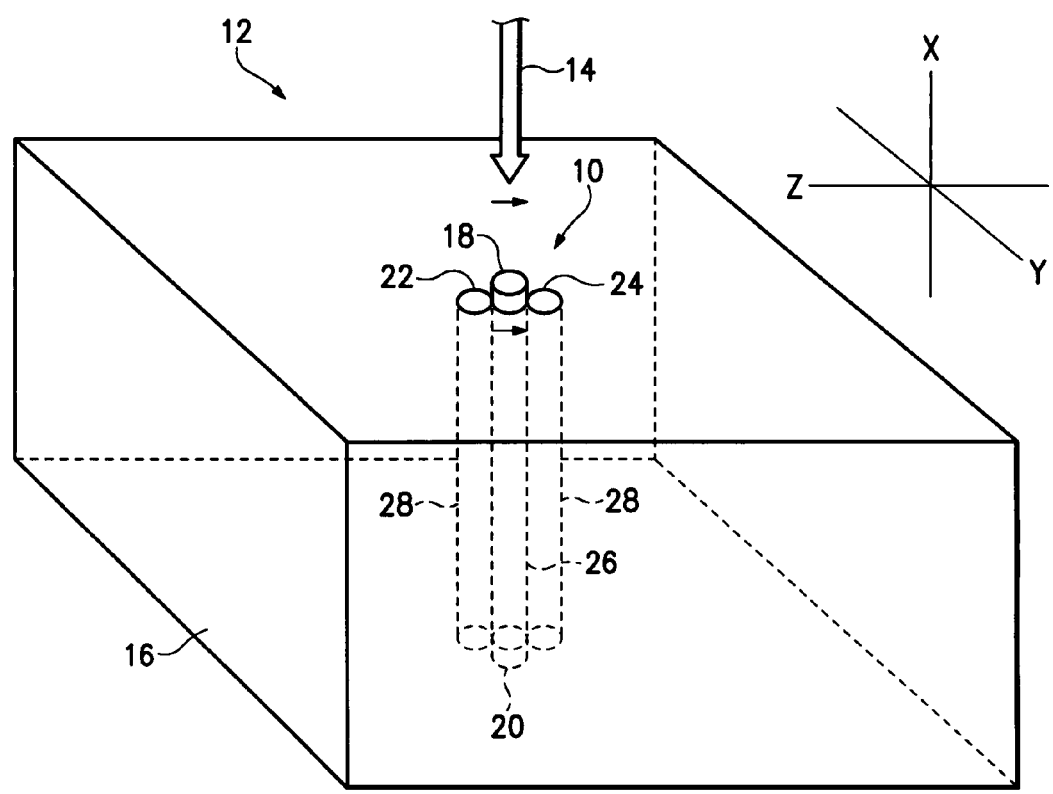
Figure 1C:
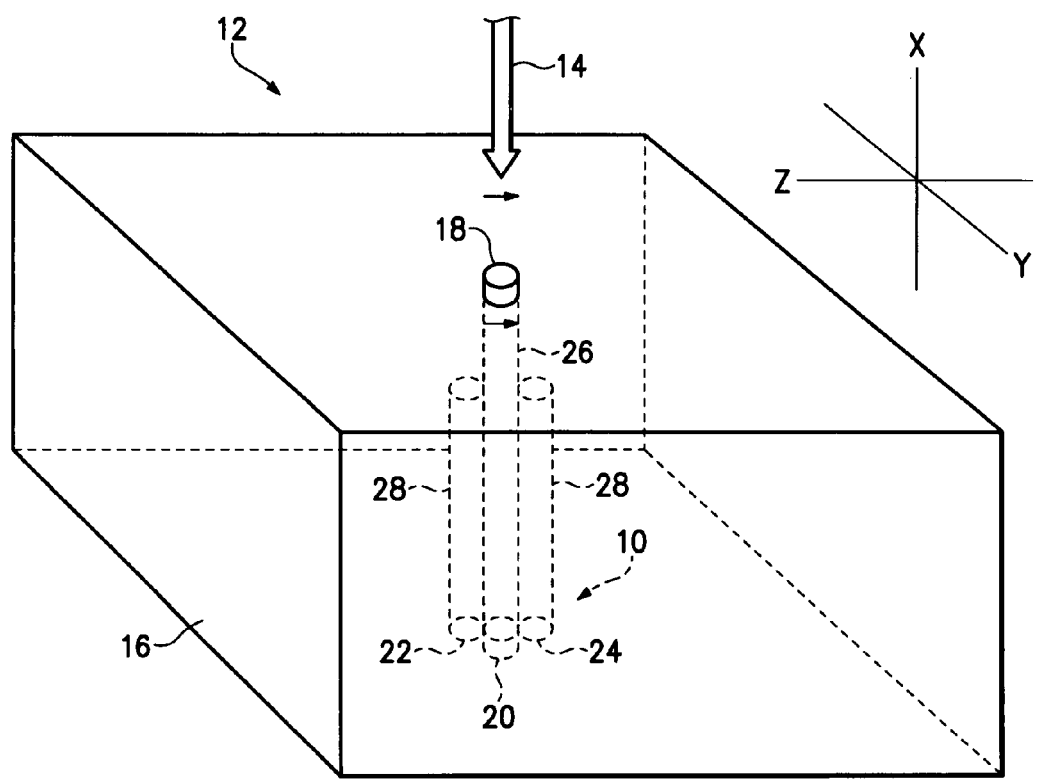

Referring to FIGS. 1A, 1B and 1C, there are shown various electrodes structures 10 usable in an optical cavity 12 incorporated into the signal acquisition probing system of the present invention. The signal acquisition probing system will be described in relation to a Fabry-Perot optical cavity but other optical cavities incorporating the electrode structure 10 may be used with the signal acquisition probing system. The optical cavity 12 has an electro-optic material 16 disposed between opposing optically reflective materials 18 and 20. The electro-optical material may be formed from inorganic and organic materials, such as Potassium Titanyl Phosphate (KTP), Rubidium Titanyl Arsenate (RTA), Rubidium Titanyl Phosphate (RTP), Zinc Telluride (ZnTe), DimethylAmino-methyl Stilbazolium Tosylate (DAST) or other electro-optic materials, such as electro-optic polymers, all having the property of a changing index of refraction in response to an applied electro-magnetic field. The inorganic and organic materials have crystallographic axes defining the crystallographic structure of the electro-optic material 16. Crystals systems are cubic, tetragonal, orthorhombic, monoclinic and triclinic. The crystallographic axes for the cubic, tetragonal and the orthorhombic systems are mutually perpendicular to each other. The monoclinic and triclinic crystal systems have one or more of the crystallographic axes at oblique angles to each other. The hexagonal crystal system has two crystallographic axes falling on the same plane at 120° to each other and a third axis orthogonal to the other two. The inorganic and organic materials further have X, Y and Z optical axes which may or may not coincide with the crystallographic axes.

The optical cavity 12 will be described below in relation to inorganic KTP electro-optic material having an orthorhombic crystalline structure and optical axes coincident with the crystallographic axes. It is understood that the optical cavity 12 is applicable to the other crystal structures and organic polymers having one or more optical axes that are responsive to an electro-magnetic field for changing the index of refraction of the electro-optic material. Further, the present invention will be described in relation to specific optical axes of the KTP electro-optic material 16 and a specific orientation of a propagating optical signal 14 and orientations of the electromagnetic field within the KTP electro-optic material 16. In the preferred embodiment, the KTP electro-optic material 16 is an X-cut crystal face where the cleaved and polished surfaces of the crystal are perpendicular to the optical X-axis. Alternatively, the KTP electro-optic material 16 may be a Y-cut crystal face. The X-cut crystal is preferred over the Y-cut crystal for minimizing distortions from the acoustic modes generated within the electro-optic material 16. It should be noted that the electro-optic properties of other crystallographic structures may result in the preferred cut crystal face being orthogonal to the optical Z-axis producing a Z-cut crystal face.

The optical signal 14 provided to the optical cavity 12 is preferably provided by a coherent optical source, such as a laser diode or the like. The optical signal 14 is polarized as either linear or circular polarized light. The optical signal preferably passes through bulk optic lenses to provide a generally collimated or focused beam onto the optically reflective materials 18. An example of a generally collimated optical signal 14 focused on an electro-optic material is a 1310 nm optical signal having an optical path diameter ranging from approximately 15 to 150 microns. Other optical path diameters may be used with the electrode structure of the present invention. The linear or circular polarization states of the optical signal 14 are normal to the propagation direction of the signal. The lateral dimensions of the optically reflective materials 18 and 20 should exceed the beam diameter of the optical signal 14 impinging on the optical cavity 12. In the embodiments of FIGS. 1A, 1B and 1C, the optically reflective materials 18 and 20 generally conform to the diameter of the optical path and are formed on the X-cut crystal faces of the electro-optic material 16. The optically reflective materials 18 is partially reflective to allow the optical signal 14 to enter and exit the optical cavity 12. In certain applications the optical reflective material 20 is preferably totally reflective causing the optical signal to enter and exit through the same optically reflective material 18. The optically reflective materials 18 and 20 are preferably ceramic mirrors formed from layers of zirconium dioxide, silicon dioxide and silicon nitride. It is important in certain applications that the optically reflective materials be non-metallic to reduce capacitive and inductive effects.

The change in the index of refraction of the electro-optic material 16 in the presence of an electro-magnetic field is a function of the orientation of the optical signal propagating in the electro-optic material 16 and the relationship of the polarization state of the optical signal 14 and the electrode structures 10 to the optical axes of the electro-optic material 16. For example, KTP electro-optic material exhibits the highest index of refraction and largest sensitivity response to an electromagnetic signal when the polarization state of the optical signal 14 and the electro-magnetic field are parallel with the optical Z-axis of the KTP material. However, the KTP electro-optic material exhibits the highest piezoelectric response along the Z-axis, and the lowest piezoelectric response along the X-axis, when the electromagnetic field is parallel to the optical Z-axis. The piezoelectric effect causes a change in the refractive index of the crystal, but also physically alters the length of the material (or strain) along the three principle crystal axes. To minimize the effect of the piezoelectric strain on the modulated signal, it is desirable to ensure that the smallest change in crystal length occurs along the crystal axis that is perpendicular to the two cavity mirrors attached to the crystal. Therefore, in the preferred embodiment, the polarization state of the optical signal 14 and the electro-magnetic field are parallel with the optical Z-axis, and the optical beam propagates through the crystal parallel to the X-axis to minimize the effects of the acoustic modes in the KTP electro-optic material on the resulting optical modulation.

The electrode structures 10 in FIGS. 1A, 1B and 1C have a pair of apertures 22 and 24 formed in the KTP electro-optic material 16 that are generally parallel to the optical path 26 of the received optical signal 14 propagating through the electro-optic material 16. The KTP electro-optic material 16 has mutually perpendicular optical axes X, Y and Z that coincide with the crystallographic axes of the KTP material. The apertures 22 and 24 are disposed on the opposite sides of the optical path 26 of the propagating optical signal 14 and are oriented parallel to the optical X-axis of the electro-optic material 16. The apertures 22 and 24 are preferably formed as close as possible to the propagating optical signal 14 with the aperture separation, for example, being in the range of 45 to 120 microns. In some applications, the apertures 22 and 24 may extend into the optical path 26 of the propagating optical signal 14. The apertures 22 and 24 in FIG. 1A have a polygonal sectional shape with an apex directed toward the optical path 26 of the propagating optical signal 14. The apexes of the polygonal shapes concentrates the electro-magnetic field across the optical path 26, which is parallel to the optical Z-axis of the electro-optic material. The polygonal electrode structure does not lend itself to usual manufacturing processes whereas a circular electrode structure as illustrated in FIG. 1B is easily produced. The circular apertures 22 and 24 in FIG. 1B have the same orientation with the optical path as in FIG. 1A. The circular apertures 22 and 24 are produced using an excimer pulsed laser that can produce apertures of approximately 100 microns in diameter and of varying depth in the electro-optic material 16. The circular apertures 22 and 24 in FIG. 1C are shown extending part way through the electro-optic material 16 and have the same orientation with the optical path in FIG. 1B. The blind hole apertures reduce the risk of damage to the electro-optic material 16 when the pulsed laser light from the excimer laser reaches the opposite end of the optical cavity 12. The aperture configurations of FIGS. 1A–1C are but three examples and other aperture configurations are possible without departing from the scope of the invention.

Electrically conductive material 28 is disposed within each of the apertures 22 and 24. The electrically conductive material 28 may take the form of conductive wires shaped to conform to the apertures 22 and 24, conductive material deposited on the inner surfaces of the apertures, conductive epoxy filling the apertures, or the like. The deposited conductive material is preferably gold plated over a layer of chromium. The electrically conductive material 28 preferably extends to the exterior surface of the one of the electro-optic material 16 to allow the electrode structure 10 to be electrically coupled to an electromagnetic source, such as a voltage source. Alternately, the electrically conductive material 28 may be connecting terminals for the voltage source where the ends of the terminals are inserted into the apertures 22 and 24. In a further alternative, the electrically conductive material 28 may reside totally within the electro-optic material 16 and the connecting terminals are inserted into the apertures 22 and 24 to make contact with the electrically conductive material 28. Forming the electrode structure 10 within the optical cavity 12 decreases the distance between the electrodes thus increasing the strength of the electric field applied across optical path 26 of the propagating optical signal 14. This increases the sensitivity of the electro-optic material 16 to the applied electric field.

In a specific embodiment where the electrically conductive material 28 is an electrically conductive epoxy, the apertures 22 and 24 extend through the optical cavity 12 and the electrically conductive epoxy fills the apertures 22 and 24. Filter paper is positioned on one side of the optical cavity 12 covering the apertures 22 and 24. A vacuum is applied to this side of the optical cavity 12 and the electrically conductive epoxy is applied to the apertures 22 and 24 on the other side of the optical cavity 12. The vacuum causes the electrically conductive epoxy to be drawn into the apertures 22 and 24. The filter paper prevents the electrically conductive epoxy from being drawn out of the apertures 22 and 24.

Figure 2A:
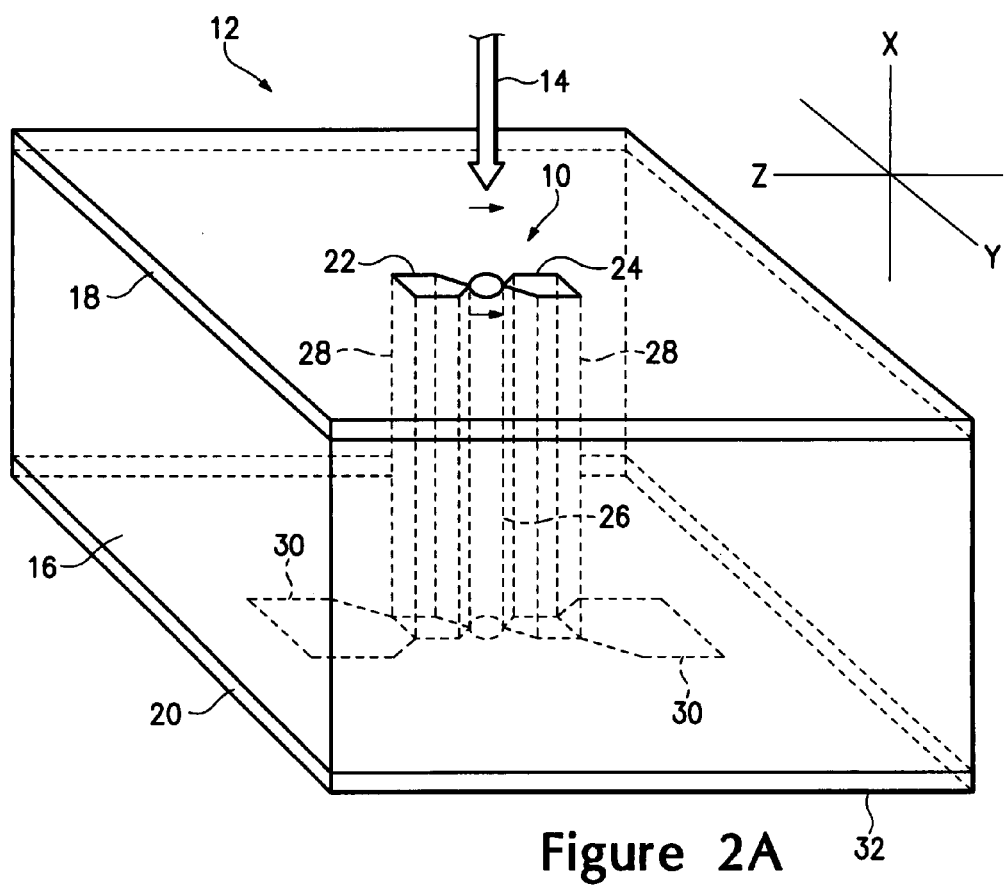
FIGS. 2A–2E illustrate alternative contact configurations for the electrode structure in the optical cavity used in a signal acquisition probing system according to the present invention.
Figure 2B:
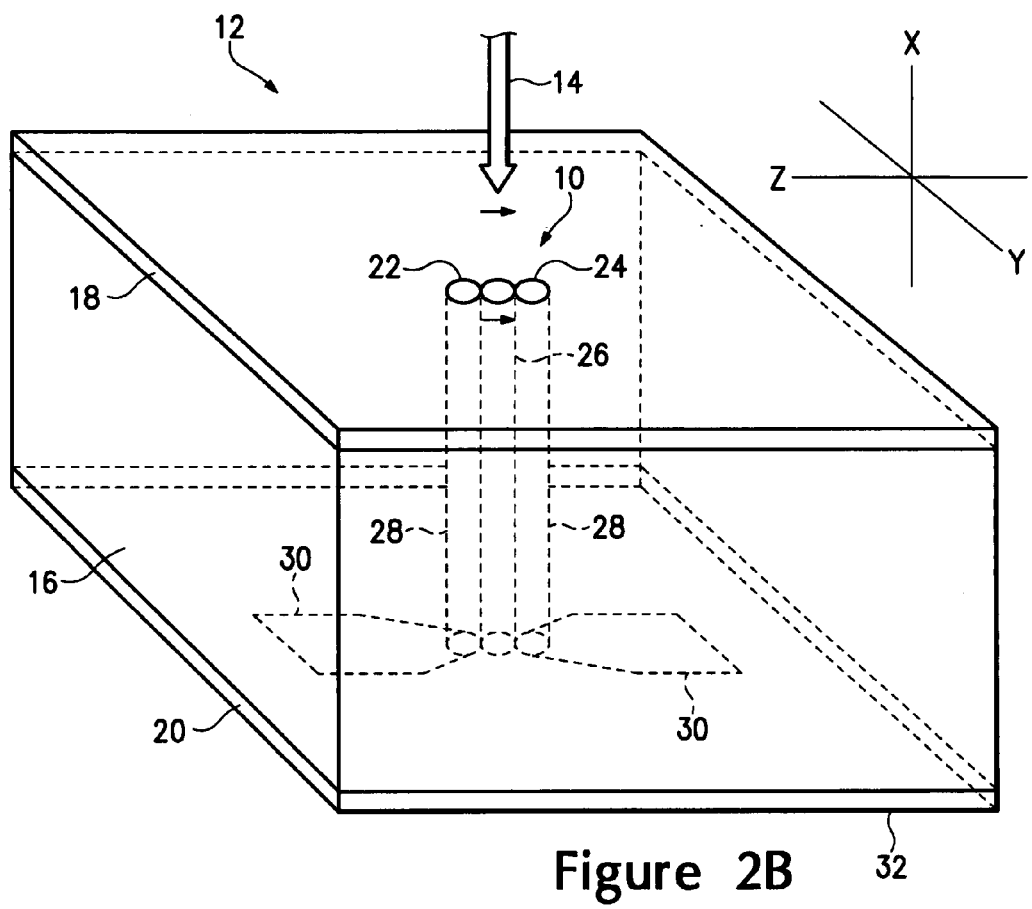
Figure 2C:
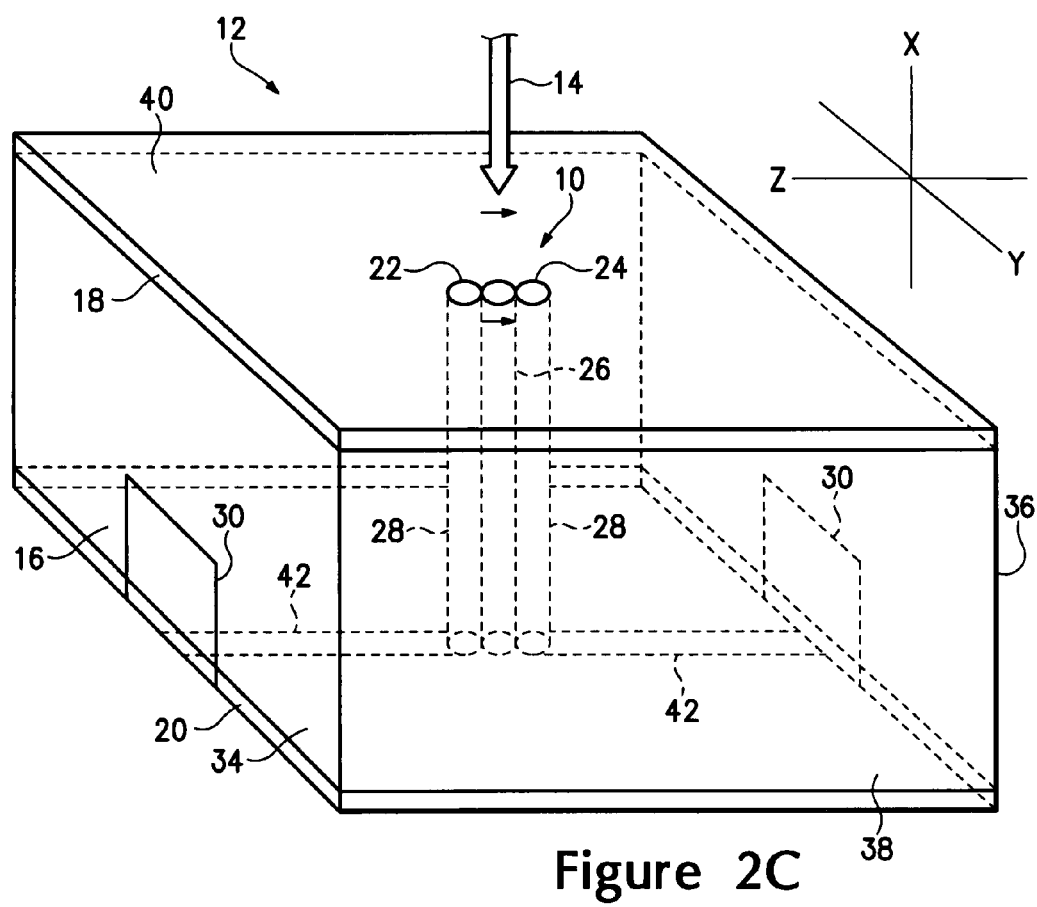
Figure 2D:
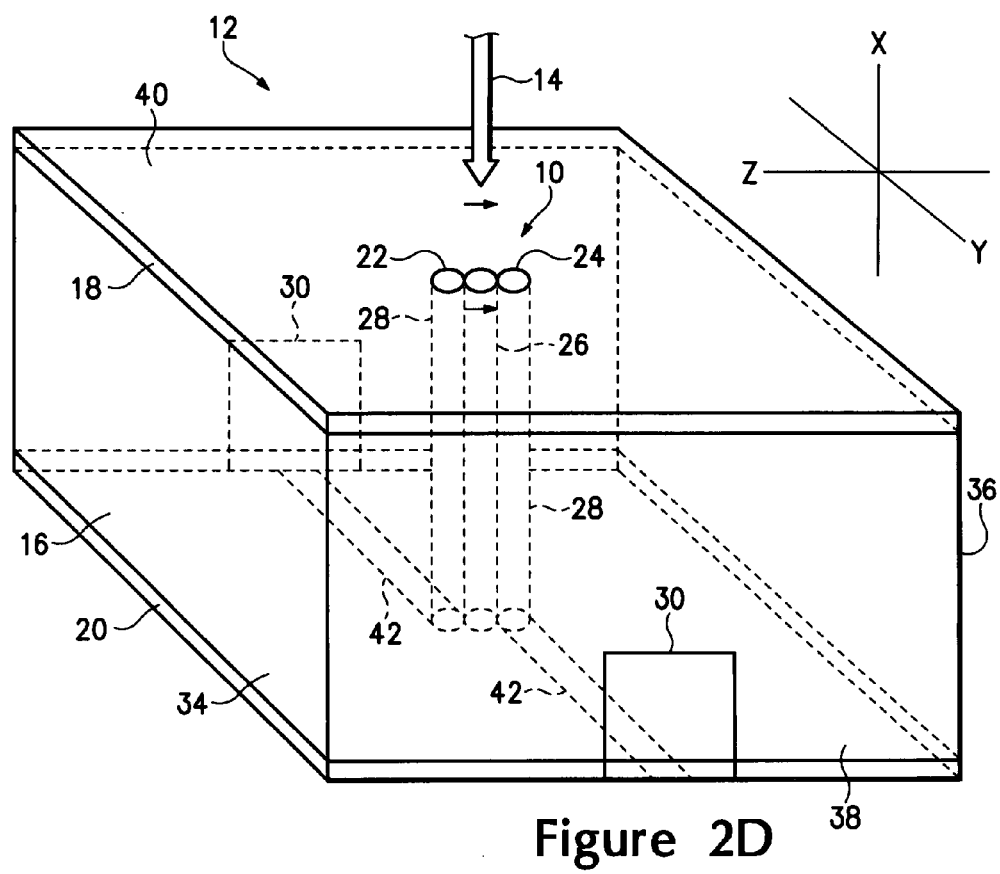
Figure 2E:
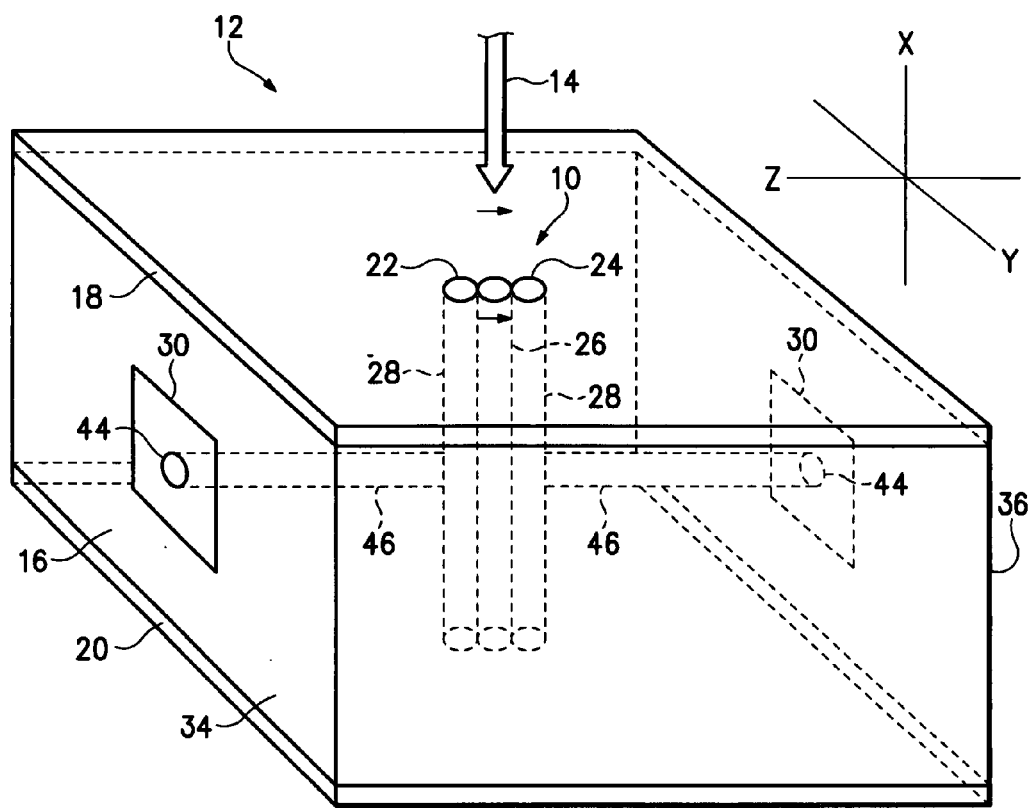

FIGS. 2A through 2E illustrate the optical cavity 12 having the optically reflective materials 18 and 20 disposed over the opposing surfaces of the electro-optic material 16. In such a configuration, the apertures 22 and 24 of the electrode structure 10 extend through a least one of the optically reflective materials 18 and 20. FIGS. 2A through 2E show alternative electrically conductive contact 30 configurations in the electrode structure 10 of the present invention. The electrically conductive contacts 30 may be formed using well know deposition techniques, such as thin and thick film processes. The electrically conductive contacts 30 are preferably formed of gold deposited over a layer of chromium. In FIGS. 2A and 2B, the electrically conductive contacts 30 are formed on the same exterior surface 32 of the optically reflective material 20 with each contact 30 in electrical contact with the electrically conductive material 28 in one of the respective apertures 22 and 24. The electrically conductive contacts 30 are preferably a polygonal shape with an apex electrically coupled to the respective electrically conductive materials 28 in the apertures 22 and 24. In the preferred embodiment where the apertures are circular as in FIG. 2B, the separation between the electrically conductive contacts 30 is in the range of 15 to 100 microns with the apertures 22 and 24 set slightly back from the apexes of the contacts 30. In FIGS. 2C and 2D, the electrically conductive contacts 30 are formed on opposing exterior surfaces 34, 36 and 38, 40 of the electro-optic material 16. Conductive traces 42 electrically couple the electrically conductive material 28 of the respective apertures 22 and 24 to the electrically conductive contacts 30 on the opposing surfaces 34, 36 and 38 and 40. While the figures illustrate the electrically conductive contacts 30 being on opposing surfaces of the electro-optic material 16, the electrically conductive contacts 30 may be formed on adjacent surfaces of the electro-optic material 16. As with the electrically conductive contacts 30 formed on the same surface, the apertures 22 and 24 intersect the conductive traces 42 with the separation between the conductive traces at the apertures 22 and 24 being in the range of 15 to 100 microns. FIG. 2E illustrates a further configuration for the electrically conductive contacts 30. Apertures 44 are formed in the electro-optic material 16 that intersect the respective electrode structure apertures 22 and 24. Electrically conductive contacts 30 are formed on the surface or surfaces of the electro-optic material 16 that intersect the apertures 44. Electrically conductive material 46 is disposed in the apertures 44 that electrically couples the electrically conductive contacts 30 to the electrically conductive material 28 in the apertures 22 and 24.

Figure 3A:
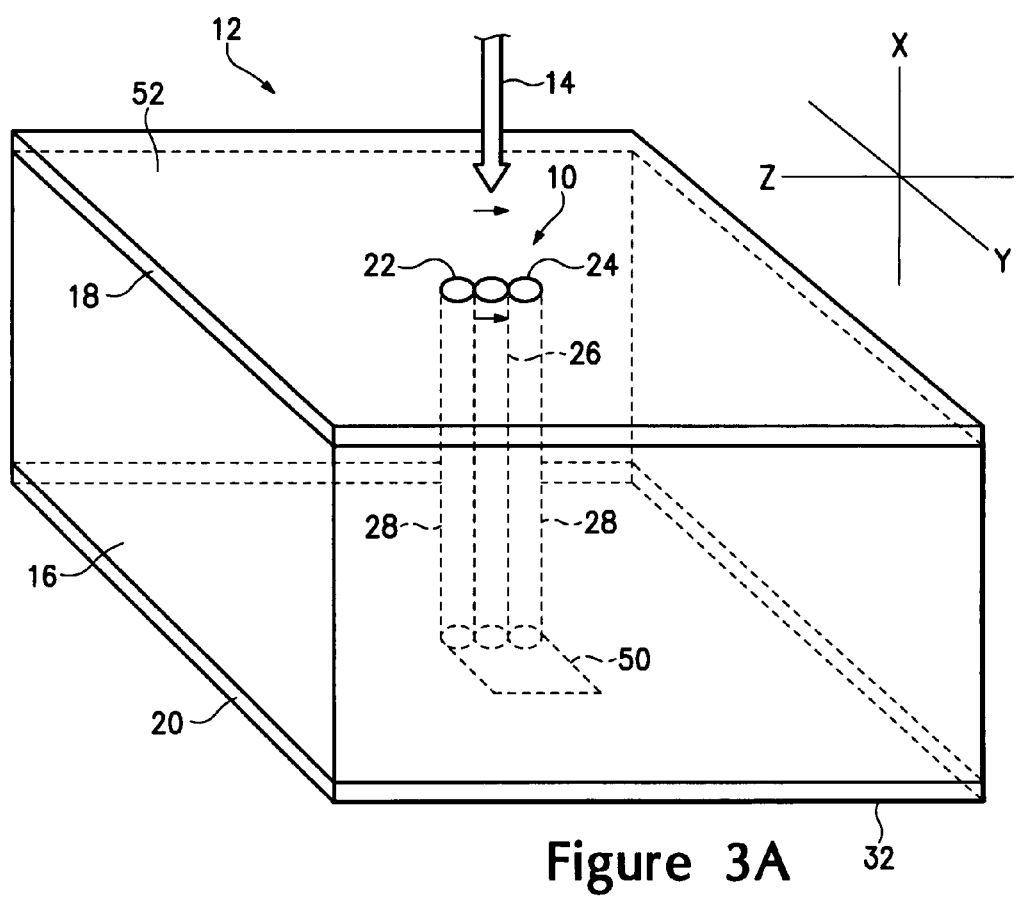
FIGS. 3A–3B illustrate alternative embodiments of the optical cavity in the signal acquisition probing system according to the present invention.
Figure 3B:
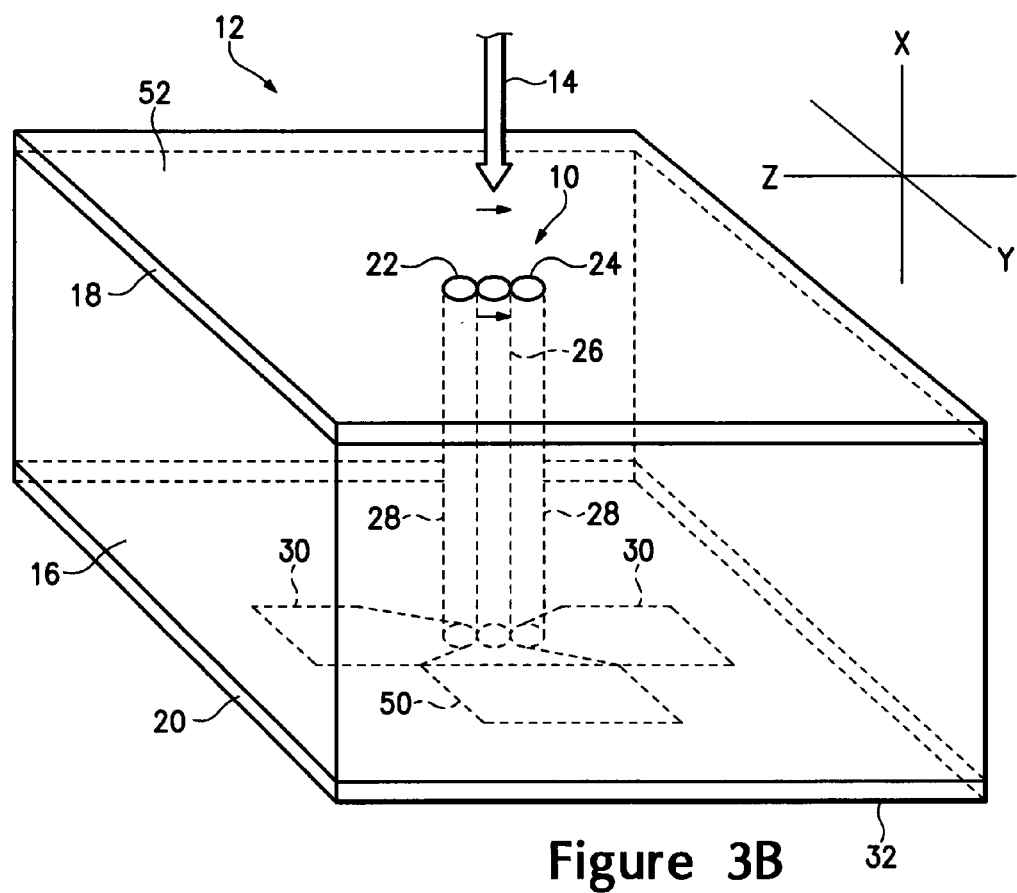

FIGS. 3A and 3B illustrate further embodiments of the optical cavity. The electrode structure 10 described has an high input impedance. In certain applications it may be preferable to match the impedance of the electrode structure 10 to the impedance of the device providing the electromagnetic energy to the electrode structure 10. In FIG. 3A, an optional termination resistor 50 is shown formed on exterior surface 32 of the optical cavity 12 that is perpendicular to the apertures 22 and 24. The termination resistor 50 is connected between the electrically conductive materials 28 in the apertures 22 and 24 of the optical cavity 12. The termination resistor 50 may be formed using well known processing techniques, such as thin or thick film processing. The resistance of the termination resistor 50 is set to match the impedance of the device driving the optical cavity 12. The termination resistor 50 may also be formed on exterior surface 52 of the optical cavity 12 where the apertures are formed as through holes in the electro-optic material. In FIG. 3B, the optional termination resistor 50 is shown connected between the electrically conductive contacts 30 on the exterior surface 32 of the optically reflective material 20. In the embodiments where conductive traces 42 couple the electrically conductive contacts to the electrically conductive materials 28 in the apertures 22 and 24, the termination resistor 50 may be coupled to the conductive traces 42.

Figure 4:
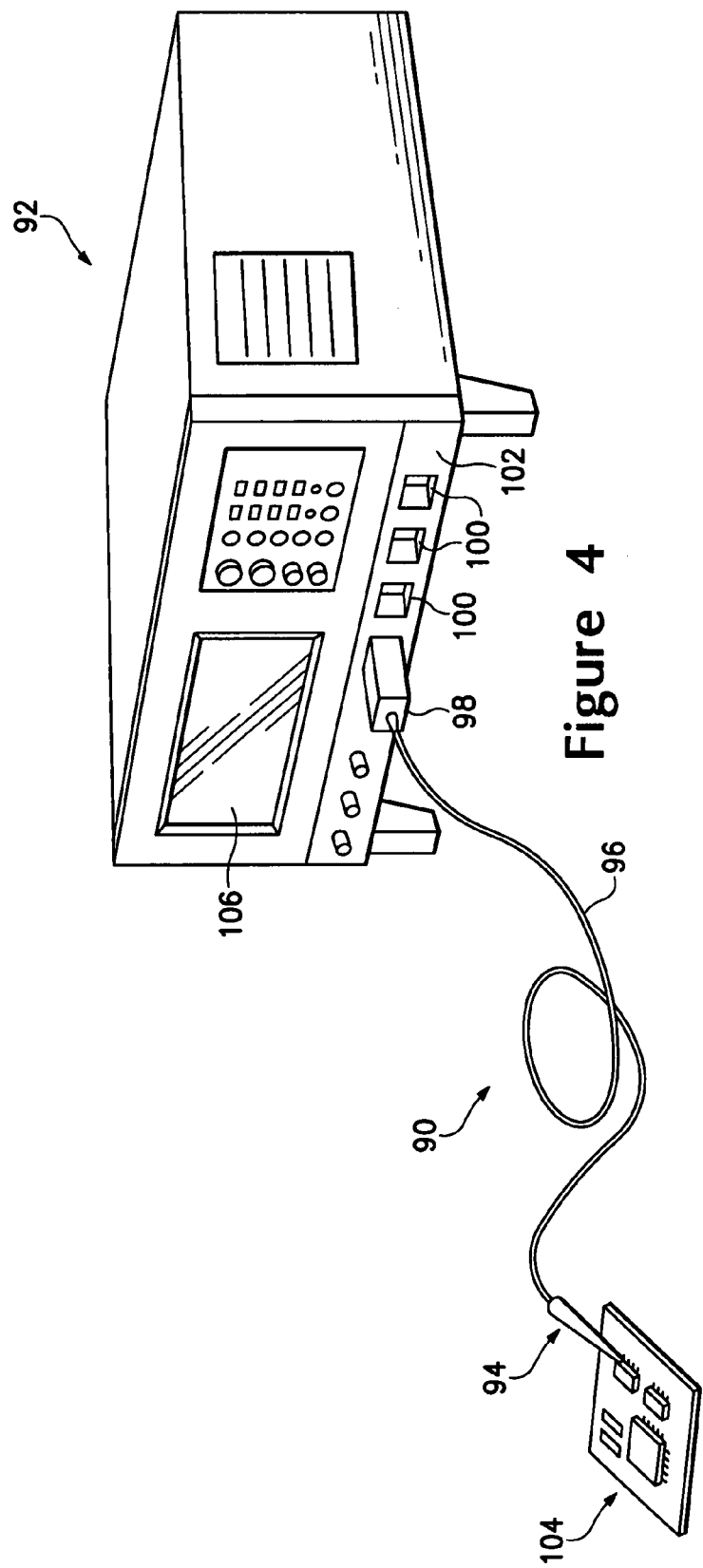
FIG. 4 illustrates a signal acquisition probing system incorporated into a voltage measurement system according to the present invention.

Referring to FIG. 4, there is illustrated a signal acquisition probing system 90 coupled to a measurement instrument 92, such as real-time or sampling oscilloscopes, logic analyzer, vector network analyzer, or the like. The signal acquisition probing system 90 has a probing head 94 containing the optical cavity 12 and an optical transmission system 96 extending from the probing head 94 to a probe interconnect housing 98. The probe interconnect housing 98 contains signal acquisition probing circuitry needed to provide an optical signal to the probing head 94 and convert the returning modulated optical signal to an electrical signal. The optical transmission system 96 preferably includes one or more optical fibers. The probe interconnect housing 98 is removably connected to one of several interconnect receptacles 100 on the front panel 102 of the measurement instrument 92. The probe interconnect housing 98 and interconnect receptacles 100 are preferably TekConnect® interface devices such as described in U.S. Pat. No. 6,402,565 and incorporated herein in its entirety by reference. The TekConnect® interface has connections for coupling a wide bandwidth signal to measurement instrument, providing electrical power from the measurement instrument 92 to the probe interconnect housing 98 and communication signals between the measurement instrument 92 to the probe interconnect housing 98 as described in U.S. Pat. No. 6,629,048 and incorporated herein in its entirety by reference. The electrical signal representing the measured signal from the device under test 104 is coupled to acquisition circuitry within the measurement instrument 92 that converts the electrical signal into digital data values and stores the data values in memory. Processing circuitry operating under program control processes the digital data values to produce display data that is displayed on a display device 106, such as a liquid crystal display, cathode ray tube or the like. Alternately, the measurement instrument 92 may include the signal acquisition probing circuitry. The probe interconnect housing 98 would then include one or more optical connectors for coupling the optical signal to the probing head 94 and the return modulated optical signal to the measurement instrument 92.

Figure 5:
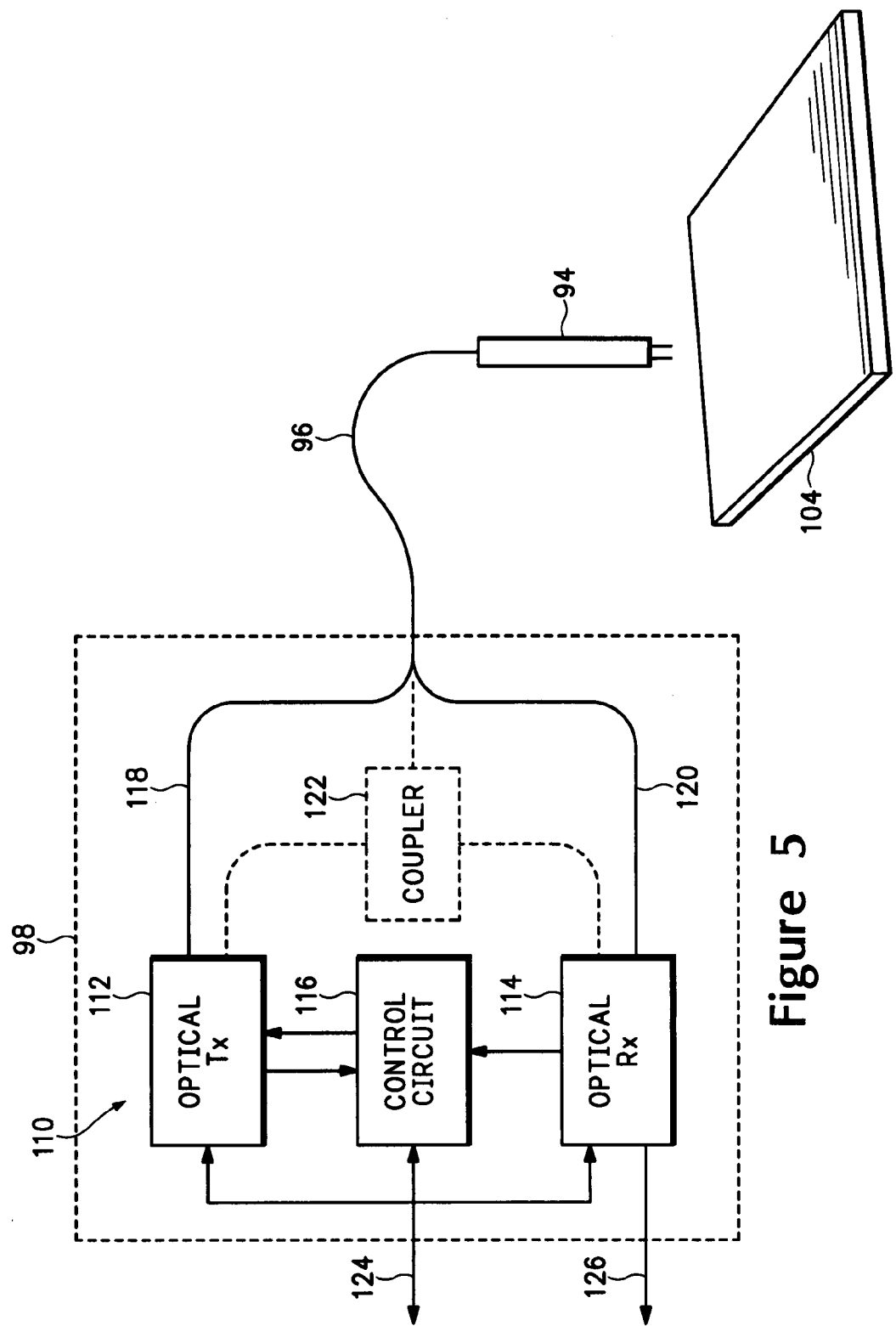
FIG. 5 general block diagram of the circuitry in the signal acquisition probing system according to the present invention.
Figure 6:
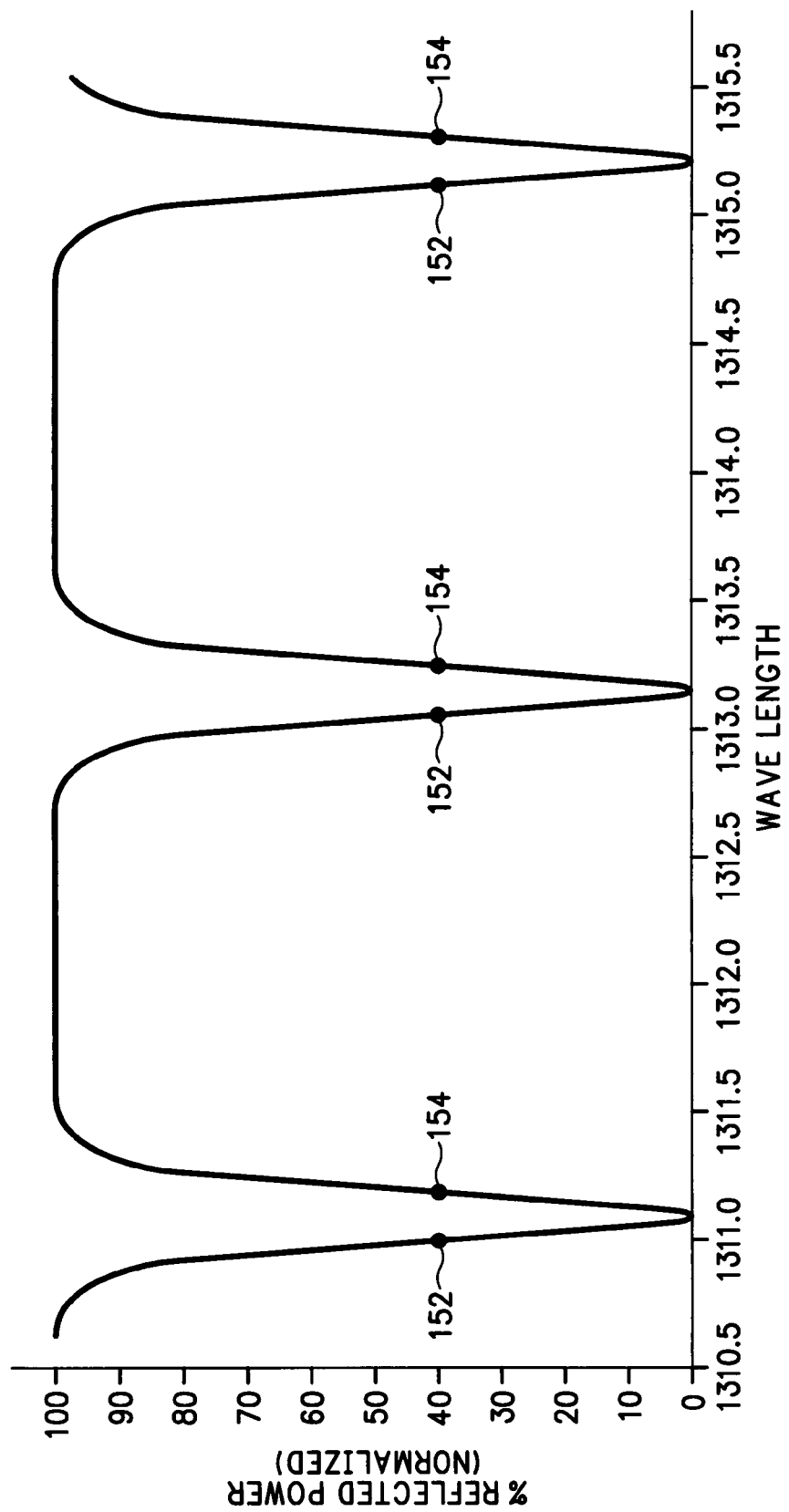
FIG. 6 illustrates the resonate wavelengths for a Fabry-Perot optical cavity used in the signal acquisition probing system according to the present invention.

FIG. 5 is a general block diagram of the signal acquisition probing circuitry 110 disposed in the probe interconnect housing 98 for a probing head 94 having a Fabry-Perot optical cavity functioning as a voltage signal sensor. The Fabry-Perot optical cavity as used in this embodiment has a Free Spectral Range of 2–4 nanometers using KTP electro-optic material having an index of refraction of 1.86 parallel to the optical Z-axis and a thickness along the optical X-axis of 0.1 to 0.2 millimeters. The Fabry-Perot optical cavity has multiple resonances defined by the Free Spectral Range. FIG. 6 illustrates the resonate wavelengths for the above described Fabry-Perot optical cavity with the horizontal axis in wavelength and the vertical axis in the normalized reflected power of the Fabry-Perot optical cavity at the input to an optical receiver. As is shown in the graph, the reflected optical power drops steeply from one-hundred percent reflected optical power to essentially zero percent optical power at the resonance points. Optimum modulated reflected power from the Fabry-Perot optical cavity is achieved on the slope of the resonance curve. This characteristic of the Fabry-Perot optical cavity is used in the implementation of the signal acquisition probing system 90. The Fabry-Perot optical cavity generates a modulated optical signal in response to a measured electrical signal from the device under test 104.

Returning to FIG. 5, the signal acquisition probing circuitry 110 includes an optical transmitter 112, optical receiver 114 and control circuitry 116 for the optical transmitter 112 and receiver 114. The optical output from the optical transmitter 112 and the optical input to the optical receiver 114 may be coupled directly to the probing head 94 via individual optical fibers 118 and 120 bundled in the optical transmission system 96. To maintain the polarization state of the optical signal from the optical transmitter 112, the optical fiber 118 is a polarization maintaining optical fiber. Alternately, the output of the optical transmitter 112 and the input to the optical receiver 114 may be optically coupled to ports on an optical directional coupler 122 with a single polarization maintaining optical fiber connecting the optical directional coupler 122 to the probing head 94. The optical directional coupler 122 is a polarization maintaining optical coupler to maintain the polarization state of the optical signal from the optical transmitter 112. Data/control and voltage power lines 124 couple the signal acquisition probing circuitry in the probe interconnect housing 98 to the measurement instrument 92. A high speed coaxial interconnect 126 couples the electrical signal from the optical receiver 114 to the measurement instrument 92.

Figure 7:
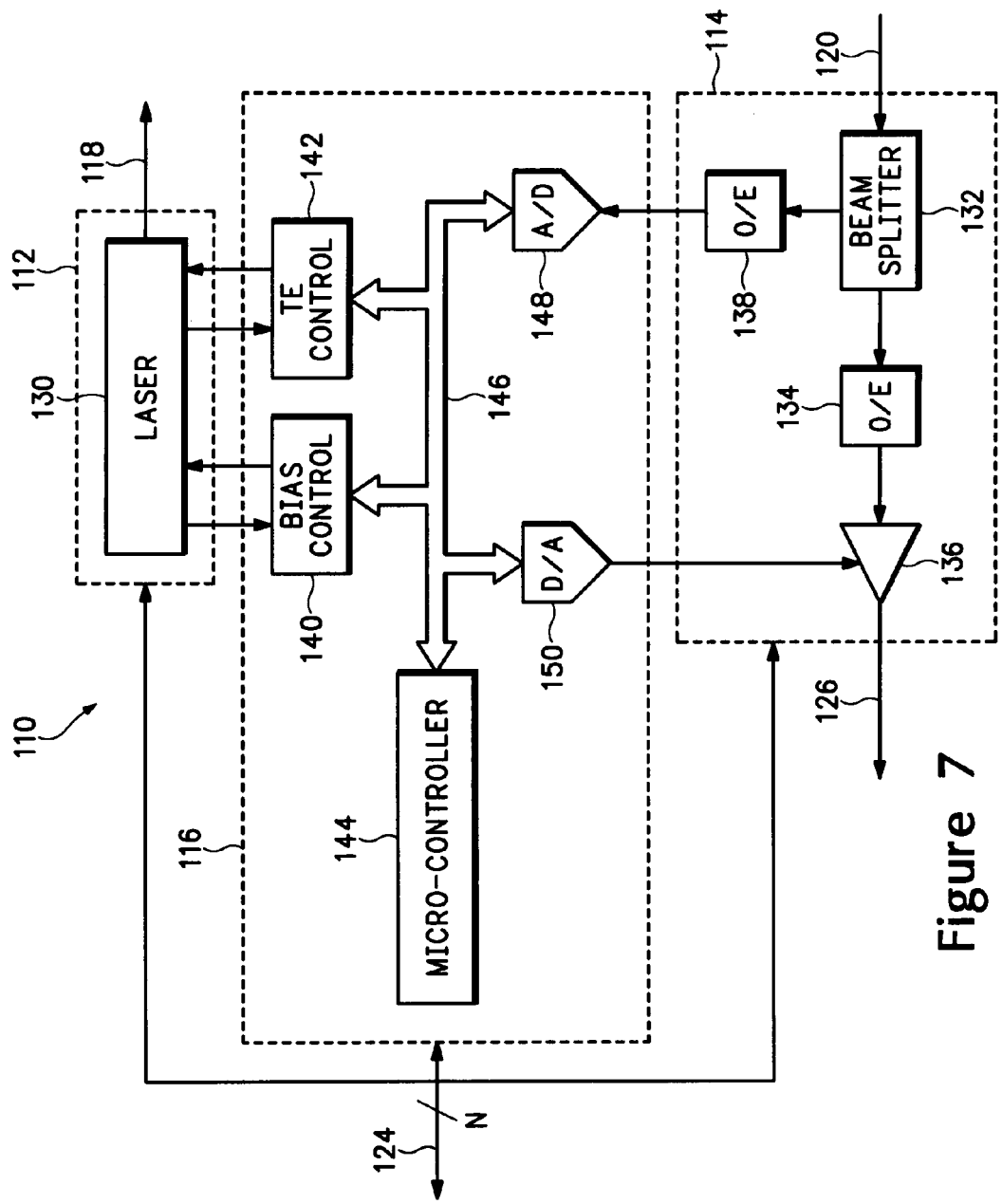
FIG. 7 illustrates more detailed block diagram of the circuitry in the signal acquisition probing system according to the present invention.

FIG. 7 is a more detailed block diagram of the signal acquisition probing circuitry 110 in the probe interconnect housing 98. The optical transmitter 112 is preferably a laser diode 130 generating an optical output having a wavelength of approximately 1310 nm. The laser diode 130 includes a thermo-electric (TE) cooler and thermistor for controlling the wavelength of the laser output and a photodetector for generating an electrical output representative of the magnitude of the laser output. The optical receiver 114 has a beam splitter 132 receiving the modulated optical output from the probing head 94. The beam splitter 132 preferably has a splitting ratio of greater than 10 to 1 with the majority of the optical signal being coupled to an optical-to-electrical converter (O/E) 134, such as a PIN or avalanche photodiode, that has a good response (sensitivity) to the wavelength of the output laser 130. The O/E converter 134 converts the return modulated optical signal to an amplitude modulated electrical signal representative of the signal being measured on the device under test 104. The electrical signal from the O/E converter 134 is amplified by amplifier circuitry 136 and coupled via the coaxial interconnect 126 to the measurement instrument 92. The O/E converter 134 and amplifier circuitry 136 form a high speed optical receiver for the measured signal from the device under test 104. The smaller portion of the optical signal from the beam splitter 132 is coupled to a second O/E converter 138 that converts the optical signal to an electrical signal. The O/E converter 138, such as a PIN or avalanche photodiode, has a good response (sensitivity) to the wavelength of the output laser 130. The second O/E converter 138 functions as a low speed device that produces an electrical signal representative of the average reflective power from the Fabry-Perot cavity.

The control circuitry 116 includes bias and thermoelectric (TE) control circuitry 140 and 142 for maintaining the laser output at a constant level and at an optimum wavelength for maximum modulated reflected power from the Fabry-Perot optical cavity. The bias and TE control circuitry 140 and 142 are coupled to a micro-controller 144 via data and control bus 146. Serial data/control and voltage lines 124 provide communications between the measurement instrument 92 and the micro-controller 144, and electrical power to the optical transmitter and receiver and control circuitry 112, 114, 116. An analog-to-digital converter (A/D) 148 converts the electrical signal from the O/E converter 138 for processing by the micro-controller 144. The micro-controller may further be coupled a digital-to-analog converter (D/A) 150 via the data and control bus 146 for controlling the gain of the amplifier circuitry 136. Additional electronically controlled circuitry, such as variable attenuators, gain cells and the like, may be incorporated into the output signal path of the optical receiver 114.

The micro-controller 144 has programmed command instructions stored in micro-controller memory for controlling the operations of the various signal acquisition probe circuits 110. The bias control circuitry 140 in conjunction with the programmed command instructions in the micro-controller 144 provides a feedback loop to maintain the optical output of the laser 130 at a constant level. The current output from the photodetector in the laser 130 increase or decreases in response to changes in the output power of the laser 130. The bias control circuitry 140 samples the electrical signal from the photodiode in the laser 130 and produces digital data values that are coupled to the micro-controller 144 via the data and control bus 146. The digital data values are processed by the micro-controller 144 to generate digital data values for driving a power amplifier. The processing may include applying scaling and calibration constants to the input digital data values to compensate for variations in the linearity of the laser output level to applied bias levels. The digital data values for driving the power amplifier are coupled to the bias control circuit via the data and control bus 146 and converted to an analog signal for application to the power amplifier. The output from the power amplifier is applied to the laser diode 130.

The circuitry for controlling the wavelength of the laser 130 provides a dual feedback loop having a local feedback loop within an overall feedback loop to maintain the optical output of the laser at a predetermined wavelength. The first feedback loop is the local feedback loop that includes the laser thermistor, the TE control circuitry 142, and the micro-controller 144. The second feedback loop includes the Fabry-Perot optical cavity in the probing head, O/E converter 138, the A/D converter 148, the micro-controller 144 and the TE control circuitry 142. The signal output from the thermistor in the laser 130 increase or decreases in response to changes in the temperature of the laser 130. The TE control circuitry 140 samples the electrical signal from the thermistor in the laser 130 and produces digital data values. The output from the O/E converter 138 representing the average reflected power from the Fabry-Perot optical cavity is converted to digital data values in the A/D converter 148. The digital data values from the TE control circuitry 142 and the A/D converter 148 are coupled to the micro-controller 144 via the data and control bus 146. The digital data values are processed by the micro-controller 144 to generate digital data values for driving a TE cooler driver. The processing may include applying scaling and calibration constants to the input digital data values to compensate for variations in the linearity of the laser output wavelength as a function of the laser temperature. The overall feedback loop is controlled by the Fabry-Perot optical cavity transfer function. The thermistor digital data values provide a course adjustment control for the wavelength of the laser 130 while the A/D digital data values provide a fine adjustment control for the laser wavelength. As shown in FIG. 6, the optimum output laser wavelength falls on either the negative or positive-going slopes 152, 154 of the reflective power curve adjacent to the resonance wavelengths of the Fabry-Perot optical cavity. The micro-controller 144 uses the thermistor digital data values to maintain the output wavelength of the laser 130 at the optimum output laser wavelength for producing the optimum modulated reflected power from the Fabry-Perot cavity for a measured electrical signal from the device under test 104. The micro-controller 144 uses the A/D converter 148 digital data values to continuously adjust the temperature of the laser 130 to maintain the output of the laser at the optimum wavelength. The digital data values generated by the micro-controller 144 are coupled to the TE control circuitry 142 via the data and control bus 146 and converted to an analog signal for application to the TE cooler driver. The output from the TE cooler driver is applied the TE cooler in the laser diode 130.

Figure 8:
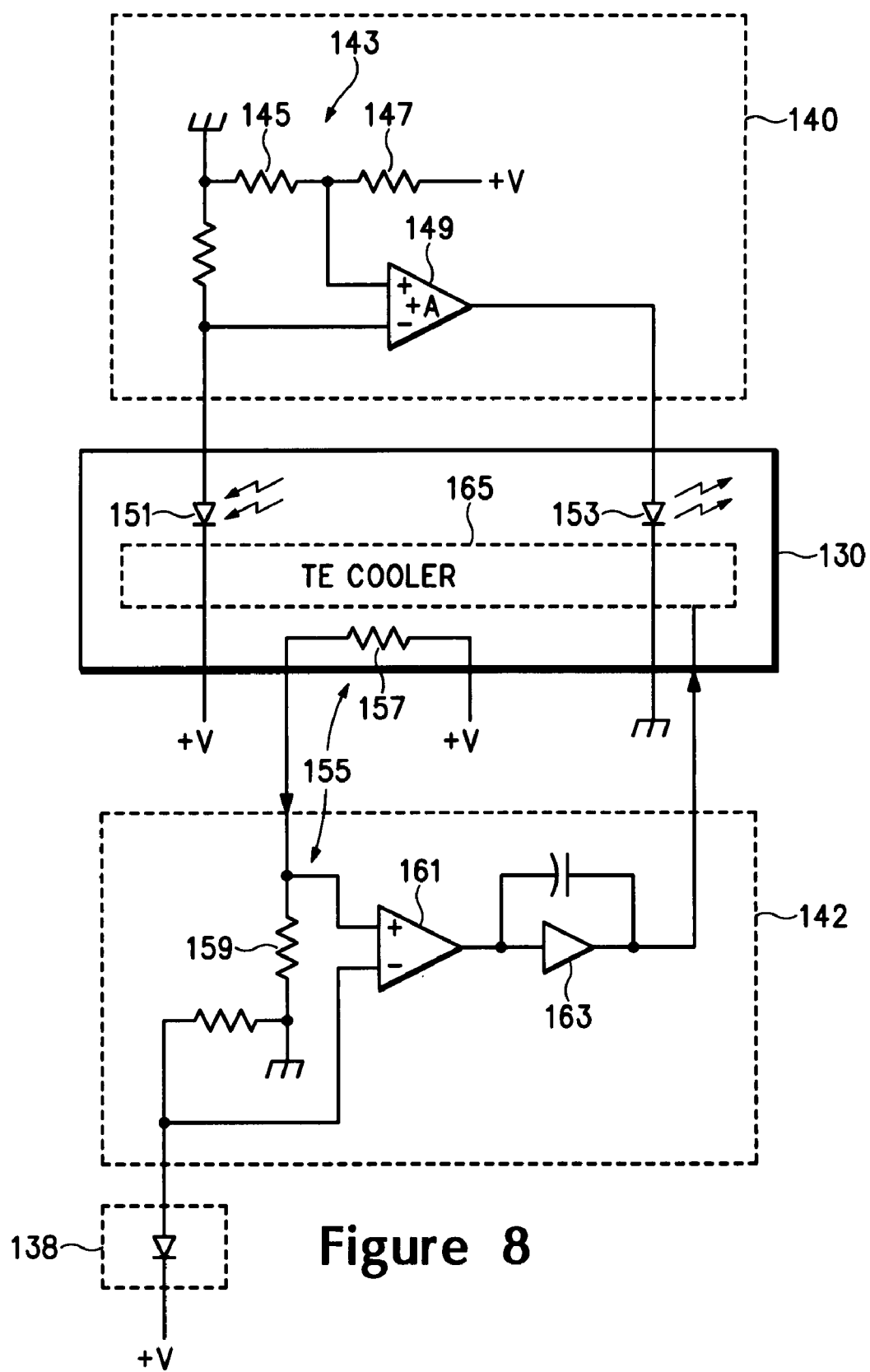
FIG. 8 illustrates an analog implementation of the bias and control circuitry in the signal acquisition probing system according to the present invention.

While the above control circuitry 116 has been described as a micro-controller based system, the circuitry may equally be implemented with analog circuitry. Referring to FIG. 8, there is illustrated representative analog bias control and TE control circuitry 140 and 142. In the analog implementation, the micro-controller 144 is decoupled from the bias and TE control circuitry 140 and 142. Further, the A/D converter 148 is removed so that the analog output of the O/E converter 138 is coupled directly to the TE control circuitry 142. The bias control circuitry 140 has a voltage divider network 143 consisting of resistors 145 and 147 that provides a reference level to the non-inverting input of a positive gain driver amplifier 149. The inventing input of the driver amplifier 149 receives the electrical signal from the photodetector 151 in the laser 130. The reference level from the intermediate node of the voltage divider network 143 sets the output of the drive amplifier 147 for driving the laser diode 153 at a desired power level. As the output of the photodetector 151 increases and decreases with changes in the output power of the laser diode 153, the voltage applied to the inverting input of the drive amplifier 149 varies the output of the drive amplifier 149. The drive amplifier 149 varies the bias on the laser diode 153 to maintain the laser output at a constant level.

The TE control circuitry 142 has a voltage divider network 155 that includes the thermistor 157 in the laser 130 coupled to a voltage source and resistor 159. The intermediate node of the voltage divider network 155 is coupled to the non-inverting input of a TE driver amplifier 161. The inverting input of the TE driver amplifier 161 is coupled to receive the electrical signal from the O/E converter 138. The output of the TE driver amplifier 161 is coupled to the input of an integrating amplifier 163. The output of the integrating amplifier 163 is coupled to the TE cooler 165 in the laser 130. The TE control circuitry 142 is designed to produce the equal voltages on the inverting and non-inverting inputs of the TE drive amplifier 161 when the optimum output laser wavelength falls on either the negative or positive-going slopes 152, 154 of the reflective power curve adjacent to the resonance wavelengths of the Fabry-Perot optical cavity. When the signal acquisition probing system is powered-up, the wavelength of the laser 130 may not be on one of the positive or negative going slopes 152, 154 of the reflective power curve. By including the integrating amplifier 163 in the TE control circuitry 142, the wavelength of the laser 130 is driven to one of the positive or negative slopes of the reflective power curve adjacent to the one of the resonant wavelength of the Fabry-Perot optical cavity. Once the laser is at the proper operating wavelength, any deviation from the optimum wavelength changes the average optical power reflected from the Fabry-Perot optical cavity. The O/E converter 138 detects the change in the average optical power and generates an output that causes the voltage to the inverting input of the TE drive amplifier 161 to increase or decrease. This causes the output voltage of the TE drive amplifier to change which causes the integrating amplifier 163 to produce a ramp signal. The ramp signal is applied to the TE cooler 165 in the laser 130 which causes the wavelength of the laser 130 to increase or decrease accordingly.

Figure 9:
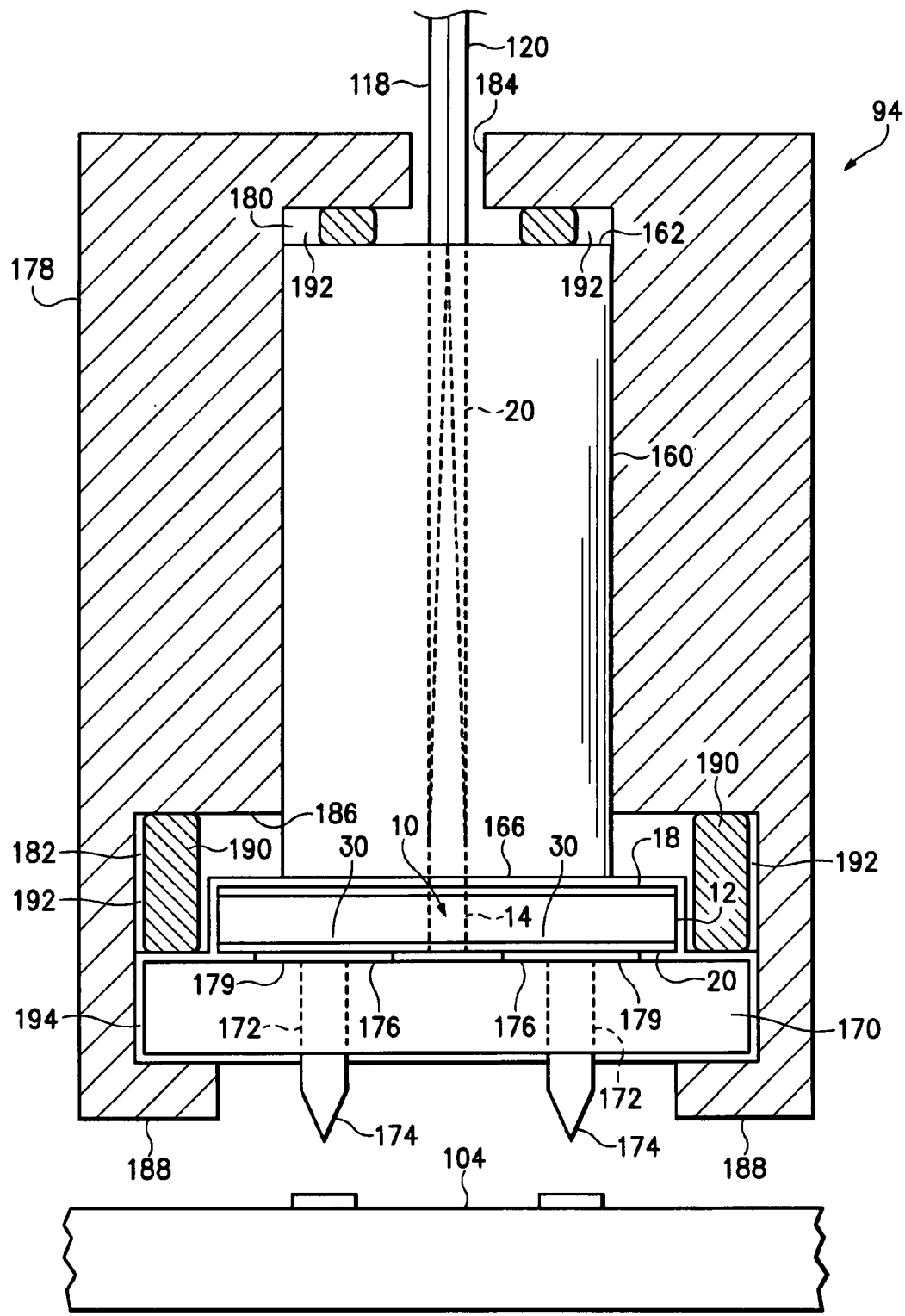
FIG. 9 illustrates a partially sectioned view of the probing components within the probing head in the signal acquisition probing system according to the present invention.

FIG. 9 is a partially sectioned view illustrating the probing components within the probing head 94. The probing components include a collimating lens 160, such as manufactured and sold by Koncent under Part No. KPMT-A-400-1310-Y-0.5-G-N. The collimating lens 160 has a length of approximately 0.25 inches and a diameter of approximately 0.1 inches. The optical fibers 118 and 120 from the signal acquisition control circuitry 110 are disposed adjacent to the top flat surface 162 of the collimating lens 160. The Fabry-Perot optical cavity 12 is secured to the opposing bottom surface 166 of the collimating lens using a non-conductive adhesive, such as epoxy or the like. The preferred structure of the Fabry-Perot optical cavity 12 is essentially the same as previously described.

The Fabry-Perot optical cavity 12 has the electrode structure 10 with electrically conductive contacts 30 formed on the bottom exterior surface of the cavity 12. The reflective coating 18 and 20 on the top and bottom surfaces of the Fabry-Perot optical cavity 12 are formed of the previously described non-conductive materials. It is important in probing applications to minimize conductive materials near the Fabry-Perot optical cavity 12 to limit inductive and capacitive interference in the operation of the optical cavity. The Fabry-Perot optical cavity 12 has a preferred length along the optical Z-axis of 1 mm, a width along the optical Y-axis of 1 mm and a thickness along the optical X-axis of 0.1 mm to 0.2 mm. The optics in the collimating lens 160 produces a collimated beam 14 from the optical fiber 118 that is focused along an optical path 20 substantially parallel to the electrode structure 10 in the Fabry-Perot optical cavity 12. The modulated optical signal generated within the Fabry-Perot optical cavity 12 exits through the reflective coating 18 and passes through the collimating lens 160 along the optical path 20 which focuses the modulated optical signal on the optical fiber 120.

Disposed adjacent to the bottom surface of the Fabry-Perot optical cavity 12 is a probe contact substrate 170 for supporting probing contacts, such as contact pads and probing tips. The probe contact substrate 170 is preferably formed of a non-conductive material, such as alumina, circuit board material or the like. In one embodiment, the probe contact substrate 170 has apertures 172 formed therein for receiving electrically conductive probing tips 174. The electrically conductive probing tips 174 are electrically coupled to the electrically conductive contacts 30 on the Fabry-Perot optical cavity 12. The electrically conductive probing tips 174 may directly contact the electrically conductive contacts 30 but it is preferable that electrically conductive contacts 176 be formed on the upper surface of the probe contact substrate 170 that are electrically coupled to the probing tips 174. The electrically conductive contacts 176 on the probe contact substrate 170 electrically contact the electrically conductive contacts 30 on the Fabry-Perot optical cavity 12. A conductive adhesive, such as epoxy or the like, is applied to the contacts 30 and 176 for securing the probe contact substrate 170 to the Fabry-Perot optical cavity 12. Alternately, flexible type electrical contacts be disposed between the probing pins 174 and the contacts 30. The flexible type contacts may take the form of electrically conductive elastomers, flexible C-type string contacts, or the like. A mechanical registration element would attach the probe contact substrate 170 to the Fabry-Perot optical cavity 12. In a further embodiment, the apertures 172 and probing tips 174 may be replaced with protrusions extending from the bottom of the probe contact substrate 170 forming the probing contacts. Electrically conductive material, such as gold plated over a layer of chromium, is disposed on the bottom surfaces of the protrusions. Electrically conductive vias are formed in the probe contact substrate 170 to electrically couple the electrically conductive contacts on the protrusions to the top surface of the substrate 170.

Optical cavities used as voltage sensing devices, such as the Fabry-Perot cavity 12, are high impedance devices. In certain probing applications it may be preferable to match the impedance at the probe to the impedance of the device under test 104. As previously described in relation to FIGS. 3A and 3B, the optional termination resistor 50 may be connected between the electrically conductive material 28 in the apertures 22 and 24 of the electrode structure 10 or between the electrically conductive contacts 30 on the exterior surface 32 of the Fabry-Perot optical cavity 12. The resistance of the termination resistor 50 is set to match the impedance of the device under test 104. This allows differential measurements to be made in a defined impedance environment, such as 50 ohms. Terminating the sensing device in the impedance of the device under test improves signal fidelity by reducing the reflections that would be caused by impedance mismatches between the device under test and the sensing device. The resistance of the termination resistor 50 may be set to various values to conform to specific device under test impedance environments. In addition, damping resistors 179 may be formed on the exterior surface of the Fabry-Perot optical cavity 12 and coupled in series with each of the electrically conductive electrodes of the electrode structure 10 or the damping resistors 179 may be formed on the probe contact substrate 170 in series with the electrically conductive contacts 176 be formed on the upper surface of the probe contact substrate 170.

The collimating lens 160, the Fabry-Perot optical cavity 12 and the probing contact substrate 170 are disposed within a non-conductive housing 178, formed from ABS plastic, poly-carbonate, poly-carbonate ABS, poly-phenylene sulfide or the like. The housing has a first cavity 180 for receiving the collimating lens 160 and a second cavity 182 for receiving the Fabry-Perot optical cavity 12 and the probe contact substrate 170. The housing has an opening 184 extending from the top surface of the housing to the first cavity 180 to allow the optical fibers 118 and 120 to be connected to the collimating lens 160. The interface between the first and second cavities 180 and 182 defines a shoulder 186. A rib 188 is formed at the bottom of the housing 178 that protrudes into the second cavity 182 for supporting the probe contact substrate 170, the Fabry-Perot optical cavity 12 and the collimating lens 160. The first and second cavities 180 and 182 are sized to closely conform to the lateral dimensions of the collimating lens 160 and the probe contact substrate 170. Both cavities 180 and 182 are sized to provide excess vertical clearance for the collimating lens 160 and the probe contact substrate 170 so as to provide axial movement of the probing elements within the housing 178. A spring mechanism 190, in the form of elastomeric material, mechanical springs or the like, is provided in the gaps 192 between the housing 178 and the collimating lens 160 and the probe contact substrate 170. The housing 178 is disposed within a probing head shell that provides strain relief for the optical fibers 118 and 120 in the cable 96 and protection and support for the elements within the housing 178.

Acoustic modes are generated in electro-optic material 12 as a result of piezoelectric effects of electromagnetic signals on electrodes connected to the electro-optic material 12. The piezoelectric effect changes the physical dimensions of the electro-optic material 12 resulting in acoustic distortion that causes optical noise to be imparted in an optical signal generated by the electro-optic material 12. In an optical cavity, such as the Fabry-Perot optical cavity 12, the changes in the physical dimensions of the optical cavity causes variances in the resonance points of the cavity. This results in acoustic distortion that is imparted as optical noise in the modulated optical return signal generated by the Fabry-Perot optical cavity 12. An acoustic damping material 194 may be applied to the Fabry-Perot optical cavity 12 and/or the probe contact substrate 170 to minimize the acoustic modes in the Fabry-Perot optical cavity 12. The acoustic damping material 194 is made of an adhesive material, such as epoxy, ultraviolet cured (UV) epoxy, urethane, silicone or the like doped with a ceramic crystalline material, such as yttrium-aluminum-garnet or the like. The acoustic impedance of the adhesive material is generally substantially less than the acoustic impedance of the electro-optic material 12 in the Fabry-Perot optical cavity 12 whereas the acoustic impedance of the ceramic crystalline material is substantially higher than the electro-optic material 12. The blend of the adhesive material and the ceramic crystalline material is formulated to match the acoustic impedance of the electro-optic material 12 in the optical cavity. For the Fabry-Perot optical cavity 12 having KTP electro-optic material, the acoustic damping material 194 using epoxy as an adhesive has between 25% and 50% by volume of yttrium-aluminum-garnet ceramic crystalline material with the preferred volume being 50%. The use of other types of adhesive material and other types of ceramic crystalline material will alter the volume percentage of the ceramic crystalline material. Further, the use of other types of electro-optic material 12 having different acoustic impedances requires different percentages or types of ceramic crystalline material. In addition, an optical absorbing material, such as carbon black, may be added to the acoustic damping material 194 to absorb optical radiation escaping the optical cavity and to prevent extraneous optical radiation from entering the optical cavity.

The acoustic damping material 194 may be applied to substantially all of the surfaces of the Fabry-Perot optical cavity 12 leaving gaps for the optical signals leaving and entering the collimating lens 160 and for the electrical connections between the electrically conductive contacts 30 on the Fabry-Perot optical cavity 12 and the electrically conductive contacts 176 on the probe contact substrate 170. In the preferred implementation, the acoustic damping material 194 is applied to substantially all of the outer exposed surfaces of the Fabry-Perot optical cavity 12 and the probe contact substrate 170. A gap is provided on the top surface of the Fabry-Perot optical cavity for the optical signals leaving and entering the collimating lens 160 and the probing contacts 174 extending from the bottom of the probe contact substrate 170 are left exposed.

The probe interconnect housing 98 is plugged into one of the interconnect receptacles 100 in the measurement instrument 92. Parameters may be set for the signal acquisition probing system 90, such as gain or attenuations levels of the optical receiver or the like, using controls on the measurement instrument 92 or via commands sent to the measurement instrument 92 via an external communications bus. The optical transmitter 112 in the signal acquisition probing circuitry 110 generates an optical output that is coupled via the optical fiber 118 in the optical transmission system 96 to the bulk optic collimating lens 160. The collimating lens 160 focuses the optical signal on the Fabry-Perot optical cavity 12. The user contacts the probing head 94 to a selected test node on the device under test 104 to acquire a signal to be measured. The measured signal may be a differential signal or a single signal. The measured signal is coupled through the probing contacts or pins 174 of the probe contact substrate 170 to the electrode structure 10 in the Fabry-Perot optical cavity 12. The electrical signal on the electrode structure 10 varies the index of refraction of the electro-optic material in the Fabry-Perot optical cavity 12 as a function of the magnitude changes in the electric signal. The changing index of refraction in the electro-optic material causes corresponding changes in the reflected optical power from the Fabry-Perot optical cavity 12. The optically modulated reflected optical power passes out of the Fabry-Perot optical cavity 12 into the collimating lens 160 which focuses the optically modulated signal onto the end of the optical fiber 120. The optical fiber 120 couples the modulated optical signal to the optical receiver of the signal acquisition probing circuitry 110. The optical receiver splits the incoming optical signal and coverts the majority of the optical signal to an electrical signal in a high speed O/E converter 134. The electrical output from the O/E converter 134 is amplified in the amplifier circuitry 136 and coupled to the measurement instrument 92 via the high speed coaxial interconnect 126. The other portion of the modulated optical signal is coupled to the slow speed O/E converter 138. The electrical output from the O/E converter 138 represents the average optical power from the Fabry-Perot optical cavity 12 and is used for adjusting the output wavelength of the laser 130 to maintain the optimum reflected optical power from the Fabry-Perot optical cavity 12.

Figure 10:
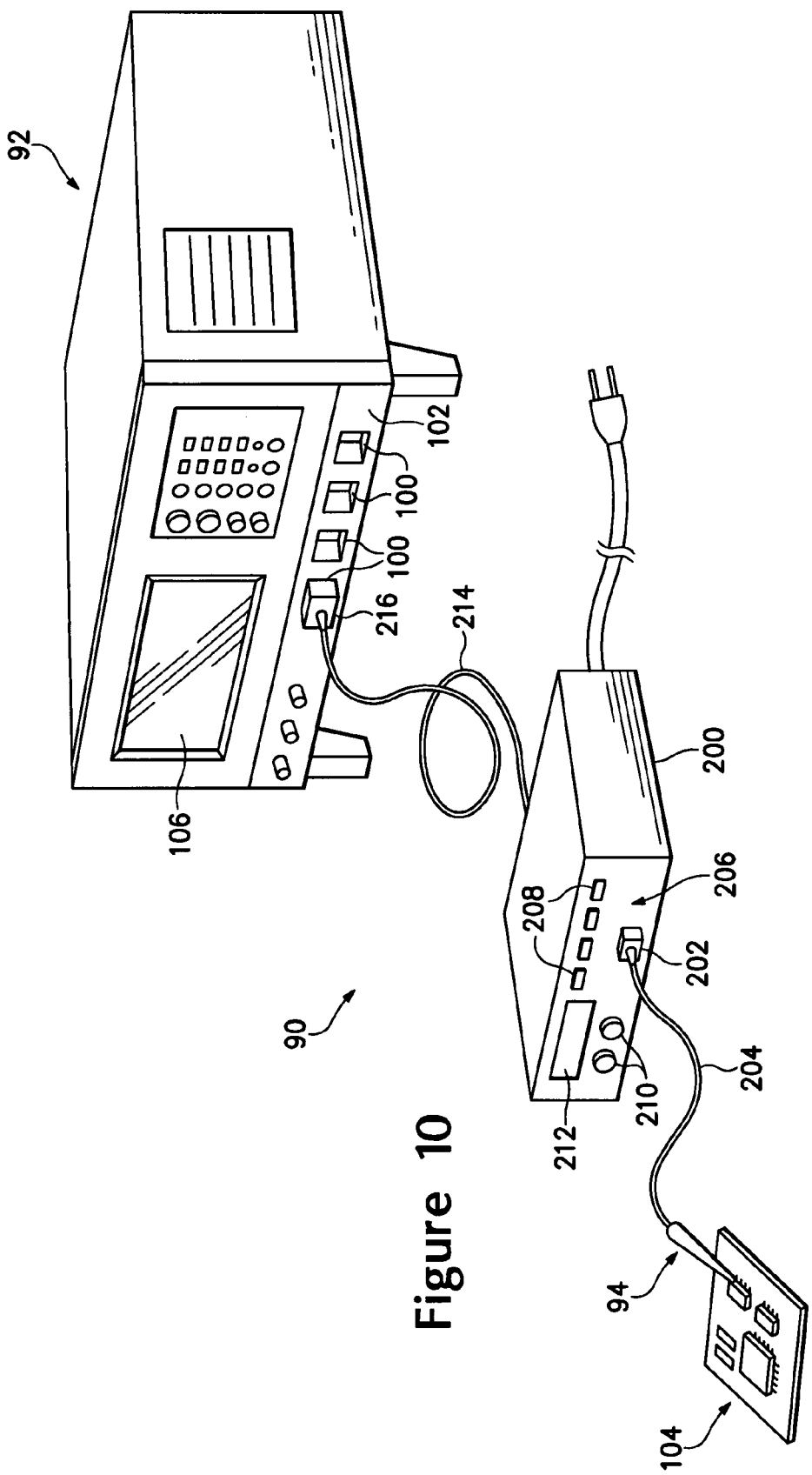
FIG. 10 illustrates a further embodiment of the voltage measurement system according to the present invention incorporating a further embodiment of the signal acquisition probing system.

FIG. 10 illustrates a further embodiment of the signal acquisition probing system 90 for probing electrical signal on a device under test 104. The probe interconnect housing 98 is replaced with an independently powered probe controller 200 and an interconnect adapter 216. The probe controller 200 contains the optical transmitter 112 that provides the optical signal to the probe head 94 and the optical receiver 114 that converts the returning modulated optical signal to an electrical signal. The probe controller 200 also includes associated processing circuitry, such as a micro-controller, memory, ASICs and the like, and a power supply for generating the necessary voltages for operating the circuitry within the controller 200. The probe controller 200 includes at least a first optical connector 202 for coupling optical signals to and from the probing head 94. In the preferred embodiment of the invention, the probe controller 200 includes two optical connectors 202 with one coupled to an optical transmitter 112 in the controller 200 and the other coupled to an optical receiver 114. The optical transmission system 204 having one or more optical fibers, depending on whether the optical signal from the transmitter and the modulated optical signal from the probe 94 are transmitted through separate fibers or through the same fiber, couples the probe controller 200 to the probing head 94. The probe controller 200 may include front panel controls 206, such as switches 208, knobs 210 and a display 212 to allow for operator inputs to the controller 200. A electrical output connector is provided for coupling a wide bandwidth coaxial cable 214 having wide bandwidth connectors, such as SMA connectors, from the probe controller 200 to the measurement instrument 92. The interconnect adapter 216, such as described in U.S. Pat. No. 6,402,549 and incorporated herein in its entirety by reference, includes a corresponding wide bandwidth connector. The interconnect adapter 216 may be modified to include signal lines for allowing communications between the measurement instrument 92 and the probe controller 200.

Figure 11:
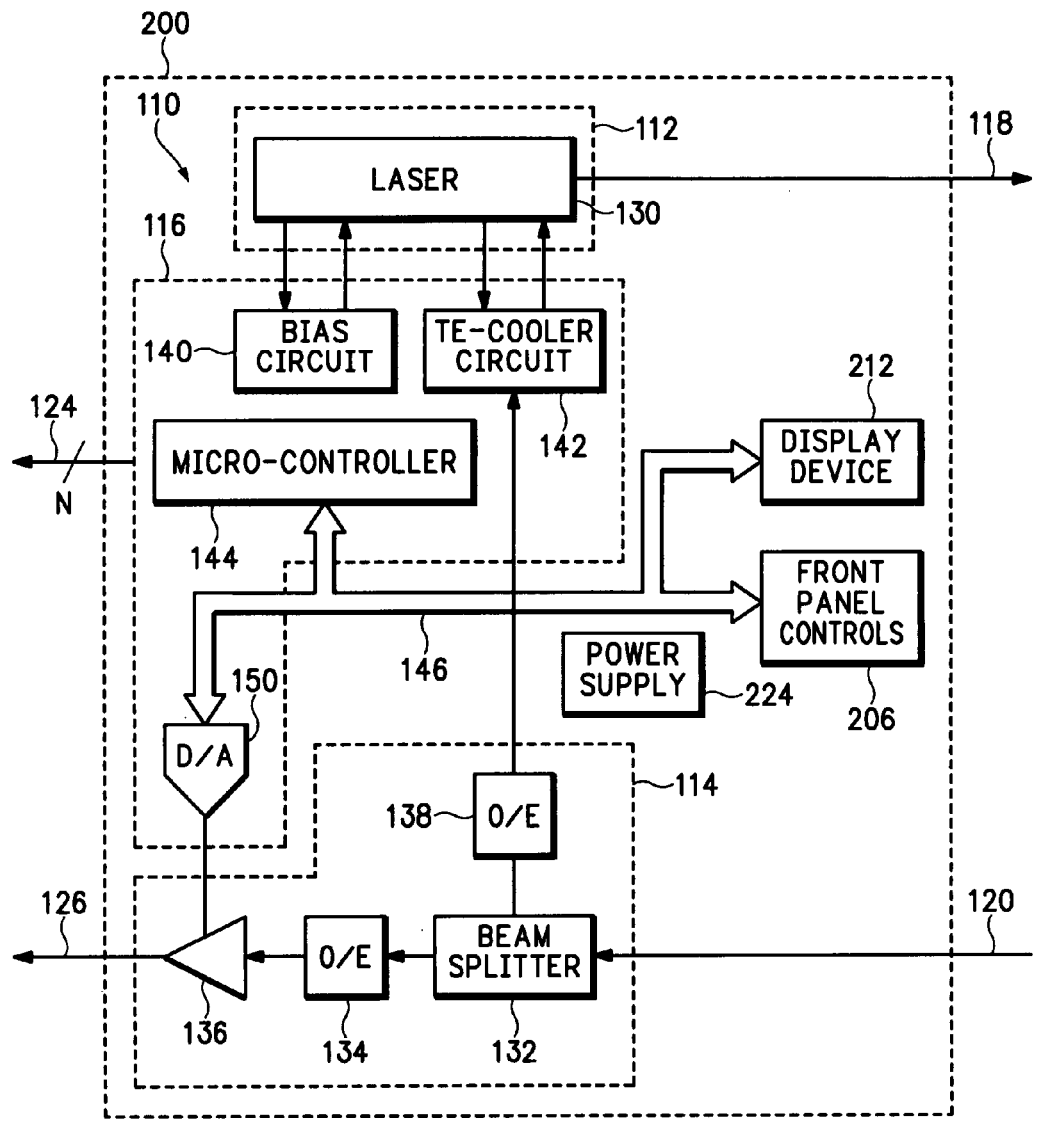
FIG. 11 is a block diagram of the probe controller in the signal acquisition probing system according to the present invention.

FIG. 11 is a block diagram of the probe controller 200 used in the signal acquisition probing system 90. Like elements from FIG. 7 are labeled the same. The signal acquisition probing circuitry 110 is shown in this embodiment has having the previously described analog bias and TE control circuits 140 and 142 with the feedback from the O/E converter 138 bring an analog signal. The optical receiver 114 has the same component structure and function as previously described. The data and control bus 146 couples the micro-controller 144 to the front panel controls 206, the display device 212 and the D/A converter 150. A power supply 224 provides voltage power to the circuits within the probe controller 200.

A signal acquisition probing system has been described where an optical cavity is used to acquire an electrical signal from a device under test. The optical cavity receives an optical signal from an optical transmitter via an optical transmission system and generates a modulated optical signal derived from the device under test electrical signal creating an electro-magnetic field distribution in electro-optic material in the optical cavity that overlaps the optical path of the optical signal propagating in the electro-optic material and varies the index of refraction of the electro-optic material in the optical path. The modulated optical signal is coupled to an optical receiver via the optical transmission system which converts the modulated optical signal to an electrical signal. The electrical signal is coupled to measurement test instrument for processing and displaying of the electrical signal. The signal acquisition probing system included control circuitry for controlling the optical power level and wavelength of the optical signal from the optical transmitter and the gain of the output electrical signal from the optical receiver.

The optical cavity is preferably a Fabry-Perot optical cavity having electrically conductive electrodes disposed in the optical cavity parallel to one of the optical axes of the cavity and generally parallel to the received optical signal propagating within the optical cavity. The electrically conductive electrodes are made in the optical cavity by forming parallel apertures in the optical cavity having electrically conductive material disposed therein.

It will be obvious to those having skill in the art that many changes may be made to the details of the above-described embodiments of this invention without departing from the underlying principles thereof. The scope of the present invention should, therefore, be determined only by the following claims.

What is claimed is:

1. A signal acquisition probing system using electro-optic detection for sensing an electrical signal from a device under test comprising:
   an optical transmitter generating a tunable, coherent optical signal;
   an optical receiver generating an output electrical signal;
   circuitry for controlling the optical power level and wavelength of the tunable, coherent optical signal from the optical transmitter and the gain of the output electrical signal from the optical receiver;
   an optical cavity having optically reflective material disposed on opposing surfaces of an electro-optic material with the tunable, coherent optical signal propagating through at least one of the optically reflective materials and within the electro-optic material;
   first and second electrically conductive electrodes receiving the electrical signal from the device under test with each of the first and second electrically conductive electrodes having an apertures formed in at least a portion of the electro-optic material generally parallel to the received optical signal propagating within the electro-optic material and electrically conductive material disposed within each of the first and second apertures; and
   an optical transmission system optically coupled to the optical transmitter, optical receiver and one of the optically reflective materials of the optical cavity providing the optical signal from the optical transmitter to the optical cavity and providing a modulated optical signal to the optical receiver representing the electrical signal from the device under test derived from the device under test electrical signal creating an electromagnetic field distribution in the electro-optic material that overlaps the optical path of the optical signal propagating in the electro-optic material and varies the index of refraction of the electro-optic material in the optical path.

2. The signal acquisition probing system as recited in claim 1 further comprising a resistor coupled between the first and second electrically conductive electrodes.

3. The signal acquisition probing system as recited in claim 1 further comprising a resistor to each of the first and second electrically conductive electrodes.

4. The signal acquisition probing system as recited in claim 1 wherein the optical cavity further comprises electrically conductive contacts formed on an at least one exterior surface of the optical cavity with the one of the electrically conductive contacts electrically coupled to the first electrically conductive electrode and the other electrically conductive contact electrically coupled to the second electrically conductive electrode.

5. The signal acquisition probing system as recited in claim 4 further comprising a resistor coupled between the electrically conductive contacts.

6. The signal acquisition probing system as recited in claim 4 further comprising a resistor coupled to each of the electrically conductive contacts.

7. The signal acquisition probing system as recited in claim 1 wherein the received optical signal propagates generally parallel to at least a first optical axis in the electro-optic material with the first and second electrically conductive electrodes generally parallel to same optical axis.

8. The signal acquisition probing system as recited in claim 1 wherein the electro-optic material has X, Y, and Z optical axes and corresponding crystal faces orthogonal to the respective X, Y, and Z optical axes with the optical cavity further comprising the opposing optically reflective materials being disposed on the Y-crystal face and the first and second electrically conductive electrodes being orthogonal to the Y-crystal face of the electro-optic material.

9. The signal acquisition probing system as recited in claim 1 wherein the electro-optic material has X, Y, and Z optical axes and corresponding crystal faces orthogonal to the respective X, Y, and Z optical axes with the optical cavity further comprising the opposing optically reflective materials being disposed on the X-crystal face and the first and second electrically conductive electrodes being orthogonal to the X-crystal face of the electro-optic material.

10. The signal acquisition probing system as recited in claim 1 wherein the electro-optic material has X, Y, and Z optical axes and corresponding crystal faces orthogonal to the respective X, Y, and Z optical axes with the optical cavity further comprising the opposing optically reflective materials being disposed on the Z-crystal face and the first and second electrically conductive electrodes being orthogonal to the Z-crystal face of the electro-optic material.

11. The signal acquisition probing system as recited in claim 1 wherein the optical cavity comprises a Fabry-Perot optical cavity.

12. The signal acquisition probing system as recited in claim 1 wherein the optical transmission system further comprises an optical directional coupler having a first port optically coupled to the optical transmitter, a second port optically coupled to the optical receiver and a third port optically coupled to one end of an optical fiber with the other end of the optical fiber optically coupled to one of the opposing optically reflective materials of the optical cavity.

13. The signal acquisition probing system as recited in claim 12 further comprising a collimating lens optically coupled to the optical fiber with the collimating lens disposed adjacent to one of the opposing optically reflective materials of the optical cavity.

14. The signal acquisition probing system as recited in claim 13 wherein the optical directional coupler is a polarization maintaining optical directional coupler having the first port optically coupled to the optical transmitter via a polarization maintaining optical fiber and the third port of the polarization maintaining optical directional coupler coupled to the collimating lens via a polarizing maintaining optical fiber.

15. The signal acquisition probing system as recited in claim 1 wherein the optical transmission system further comprises:
   a polarizing maintaining optical fiber optically coupled to the optical transmitter;

a collimating lens optically coupled to the polarizing maintaining optical fiber with the collimating lens disposed adjacent to one of the opposing optically reflective materials of the optical cavity; and an optical fiber optically coupled to the collimating lens and the optical receiver.

16. The signal acquisition probing system as recited in claim 1 wherein the optical receiver further comprises:

at least a first optical-to-electrical converter coupled to receive the modulated optical signal from the optical cavity via the optical transmission system and generating an electrical signal; and an amplifier coupled to receive the electrical signal from the optical-to-electrical converter and generating an electrical signal representative of the electrical signal from the device under test.

17. The signal acquisition probing system as recited in claim 16 wherein the optical receiver further comprises an optical beam splitter optically coupled to receive the modulated optical signal from the optical cavity and optically coupling a first portion of the modulated optical signal to the first optical-to-electrical converter and a second portion to a second optical-to-electrical converter.

18. The signal acquisition probing system as recited in claim 17 wherein the second optical-to-electrical converter generates an electrical signal that is coupled to the control circuitry for varying the wavelength of the coherent optical signal of the optical transmitter to maintain an optimum modulated reflected power from the optical cavity.

19. The signal acquisition probing system as recited in claim 17 wherein the optical bean splitter optically couples greater than ninety percent of the modulated optical signal to the first optical-to-electrical converter and less than ten percent to the second optical-to-electrical converter.

20. The signal acquisition probing system as recited in claim 1 further comprising an acoustic damping material substantially covering the optical cavity to minimize acoustic modes in the optical cavity.

21. A voltage measurement system sensing and displaying an electrical signal from a device under test comprising:

a measurement instrument processing and displaying the electrical signal from the device under test;

a signal acquisition probing system coupled to the measurement instrument and sensing the electrical signal from the device under test using electro-optic detection comprising:

an optical transmitter generating a tunable, coherent optical signal;

an optical receiver generating an output electrical signal coupled to the measurement instrument;

circuitry for controlling the optical power level and wavelength of the tunable, coherent optical signal from the optical transmitter and the gain of the output electrical signal from the optical receiver;

an optical cavity having optically reflective material disposed on opposing surfaces of an electro-optic material with the tunable, coherent optical signal propagating through at least one of the optically reflective materials and within the electro-optic material;

first and second electrically conductive electrodes receiving the electrical signal from the device under test with each of the first and second electrically conductive electrodes having an apertures formed in at least a portion of the electro-optic material generally parallel to the received optical signal propagating within the electro-optic material and electrically conductive material disposed within each of the first and second apertures; and an optical transmission system optically coupled to the optical transmitter, optical receiver and one of the optically reflective materials of the optical cavity providing the optical signal from the optical transmitter to the optical cavity and providing a modulated optical signal to the optical receiver representing the electrical signal from the device under test derived from the device under test electrical signal creating an electromagnetic field distribution in the electro-optic material that overlaps the optical path of the optical signal propagating in the electro-optic material and varies the index of refraction of the electro-optic material in the optical path.

22. The voltage measurement system as recited in claim 21 further comprising a resistor coupled between the first and second electrically conductive electrodes.

23. The voltage measurement system as recited in claim 21 further comprising a resistor coupled to each of the electrically conductive electrodes.

24. The voltage measurement system as recited in claim 21 wherein the optical cavity further comprises electrically conductive contacts formed on an at least one exterior surface of the optical cavity with the one of the electrically conductive contacts electrically coupled to the first electrically conductive electrode and the other electrically conductive contact electrically coupled to the second electrically conductive electrode.

25. The voltage measurement system as recited in claim 24 further comprising a resistor coupled between the electrically conductive contacts.

26. The voltage measurement system as recited in claim 24 further comprising a resistor coupled to each of the electrically conductive contacts.

27. The voltage measurement system as recited in claim 21 wherein the received optical signal propagates generally parallel to at least a first optical axis in the electro-optic material with the first and second electrically conductive electrodes generally parallel to same optical axis.

28. The voltage measurement system as recited in claim 21 wherein the electro-optic material has X, Y, and Z optical axes and corresponding crystal faces orthogonal to the respective X, Y, and Z optical axes with the optical cavity further comprising the opposing optically reflective materials being disposed on the Y-crystal face and the first and second electrically conductive electrodes being orthogonal to the Y-crystal face of the electro-optic material.

29. The voltage measurement system as recited in claim 21 wherein the electro-optic material has X, Y, and Z optical axes and corresponding crystal faces orthogonal to the respective X, Y, and Z optical axes with the optical cavity further comprising the opposing optically reflective materials being disposed on the X-crystal face and the first and second electrically conductive electrodes being orthogonal to the X-crystal face of the electro-optic material.

30. The voltage measurement system as recited in claim 21 wherein the electro-optic material has X, Y, and Z optical axes and corresponding crystal faces orthogonal to the respective X, Y, and Z optical axes with the optical cavity further comprising the opposing optically reflective materials being disposed on the Z-crystal face and the first and second electrically conductive electrodes being orthogonal to the Z-crystal face of the electro-optic material.

31. The voltage measurement system as recited in claim 21 wherein the optical cavity comprises a Fabry-Perot optical cavity.

32. The voltage measurement system as recited in claim 21 wherein the optical transmission system further comprises an optical directional coupler having a first port optically coupled to the optical transmitter, a second port optically coupled to the optical receiver and a third port optically coupled to one end of an optical fiber with the other end of the optical fiber optically coupled to one of the opposing optically reflective materials of the optical cavity.

33. The voltage measurement system as recited in claim 32 further comprising a collimating lens optically coupled to the optical fiber with the collimating lens disposed adjacent to one of the opposing optically reflective materials of the optical cavity.

34. The voltage measurement system as recited in claim 33 wherein the optical directional coupler is a polarization maintaining optical directional coupler having the first port optically coupled to the optical transmitter via a polarization maintaining optical fiber and the third port of the polarization maintaining optical directional coupler coupled to the collimating via a polarizing maintaining optical fiber.

35. The voltage measurement system as recited in claim 21 wherein the optical transmission system further comprises:
a polarizing maintaining optical fiber optically coupled to the optical transmitter;
a collimating lens optically coupled to the polarizing maintaining optical fiber with the collimating lens disposed adjacent to one of the opposing optically reflective materials of the optical cavity; and
an optical fiber optically coupled to the collimating lens and the optical receiver.

36. The voltage measurement system as recited in claim 21 wherein the optical receiver further comprises:
at least a first optical-to-electrical converter coupled to receive the modulated optical signal from the optical cavity via the optical transmission system and generating an electrical signal; and
an amplifier coupled to receive the electrical signal from the optical-to-electrical converter and generating an electrical signal representative of the electrical signal from the device under test.

37. The voltage measurement system as recited in claim 36 wherein the optical receiver further comprises an optical beam splitter optically coupled to receive the modulated optical signal from the optical cavity and optically coupling a first portion of the modulated optical signal to the first optical-to-electrical converter and a second portion to a second optical-to-electrical converter.

38. The voltage measurement system as recited in claim 37 wherein the second optical-to-electrical converter generates an electrical signal that is coupled to the control circuitry for varying the wavelength of the coherent optical signal of the optical transmitter to maintain an optimum modulated reflected power from the optical cavity.

39. The voltage measurement system as recited in claim 37 wherein the optical bean splitter optically couples greater than ninety percent of the modulated optical signal to the first optical-to-electrical converter and less than ten percent to the second optical-to-electrical converter.

40. The voltage measurement system as recited in claim 21 further comprising an acoustic damping material substantially covering the optical cavity to minimize acoustic modes in the optical cavity.

41. The voltage measurement system as recited in claim 21 wherein the optical transmitter, optical receiver and the control circuitry as disposed in a probe interconnect housing wherein the measurement instrument and the probe interconnect housing have an interface for coupling the electrical signal from the device under test to the measurement instrument, coupling communications data between the measurement instrument and the signal acquisition probing system and coupling electrical power to the signal acquisition probing system from the measurement instrument.

42. The voltage measurement system as recited in claim 21 further comprising a probe controller having the optical transmitter, optical receiver, control circuitry, a micro-controller and power supply disposed therein with the microcontroller receiving inputs for controlling the operations of the optical transmitter, optical receiver and the control circuitry and the power supply providing electrical power the optical and electrical circuits, the probe controller having optical and electrical output connectors for coupling the electrical signal from the device under test to the measurement instrument via an electrical cable and coupling the optical signal from the optical transmitter to the optical cavity and a modulated optical signal to the optical receiver via the optical transmission system.

43. The voltage measurement system as recited in claim 21 wherein the measurement instrument comprises an oscilloscope.

44. The voltage measurement system as recited in claim 21 wherein the measurement instrument comprises a logic analyzer.

45. The voltage measurement system as recited in claim 21 wherein the measurement instrument comprises a vector network analyzer.

* * * * *